(12) United States Patent
Haga

(10) Patent No.: US 12,376,495 B2
(45) Date of Patent: Jul. 29, 2025

(54) POLYMER-BASED PIEZOELECTRIC COMPOSITE MATERIAL AND PIEZOELECTRIC FILM

(71) Applicant: FUJIFILM Corporation, Tokyo (JP)

(72) Inventor: Masayuki Haga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 891 days.

(21) Appl. No.: 17/556,933

(22) Filed: Dec. 20, 2021

(65) Prior Publication Data

US 2022/0116714 A1 Apr. 14, 2022

Related U.S. Application Data

(63) Continuation of application No. PCT/JP2020/022508, filed on Jun. 8, 2020.

(30) Foreign Application Priority Data

Jun. 28, 2019 (JP) ................................ 2019-121255

(51) Int. Cl.
*H10N 30/85* (2023.01)
*H10N 30/88* (2023.01)

(52) U.S. Cl.
CPC ......... *H10N 30/852* (2023.02); *H10N 30/883* (2023.02)

(58) Field of Classification Search
CPC ............... H04R 17/005; H10N 30/045; H10N 30/2047; H10N 30/092; H10N 30/883; H10N 30/852
See application file for complete search history.

(56) References Cited

U.S. PATENT DOCUMENTS 9,444,030 B2 * 9/2016 Wang .................. H10N 30/098
9,761,784 B2 9/2017 Miyoshi
(Continued)

FOREIGN PATENT DOCUMENTS

CN 107124880 9/2017
JP 2014014063 1/2014
(Continued)

OTHER PUBLICATIONS

Office Action of Korean Counterpart Application, with English translation thereof, issued on Oct. 20, 2023, pp. 1-13.
(Continued)

*Primary Examiner* — J. San Martin
(74) *Attorney, Agent, or Firm* — JCIPRNET

(57) ABSTRACT

Provided are a polymer-based piezoelectric composite material and a piezoelectric film having piezoelectric conversion characteristics stabilized by suppressing a change in piezoelectric conversion efficiency in various humidity environments. The polymer-based piezoelectric composite material is a polymer-based piezoelectric composite material including piezoelectric particles in a matrix containing a polymer material, in which a pore volume per unit area is in a range of 0.01 μL/mm² to 1.7 μL/mm², which is acquired in a manner that a mercury penetration amount of a sample obtained by cutting a polymer-based piezoelectric composite material in a thickness direction and cutting out the polymer-based piezoelectric particle into a size of 12.5 mm×25 mm is measured by a mercury penetration method, and the penetration amount is divided by an area of a cross-section of the sample.

18 Claims, 4 Drawing Sheets

(56) References Cited

U.S. PATENT DOCUMENTS

| | | | |
|---|---|---|---|
| 10,538,461 | B2 | 1/2020 | Deville et al. |
| 2012/0274178 | A1 | 11/2012 | Ochi et al. |
| 2017/0331030 | A1 | 11/2017 | Inoue et al. |
| 2022/0115582 | A1* | 4/2022 | Tsuruoka .............. H10N 30/872 |
| 2022/0243022 | A1* | 8/2022 | Yan .......................... C08L 79/08 |
| 2023/0122929 | A1* | 4/2023 | Vella ........................ C09D 7/63 |
| | | | 264/401 |

FOREIGN PATENT DOCUMENTS

| | | |
|---|---|---|
| JP | 2014195132 | 10/2014 |
| JP | 2016063286 | 4/2016 |
| JP | 6193194 | 9/2017 |
| KR | 20170020437 | 2/2017 |
| WO | 2011083611 | 7/2011 |
| WO | 2016121765 | 8/2016 |

OTHER PUBLICATIONS

X.J. Fan et al., "Experimental investigations and model study of moisture behaviors in polymeric materials", Microelectronics Reliability, Apr. 23, 2009, pp. 1-11, vol. 49, Issue 8.

"Search Report of Europe Counterpart Application", issued on May 12, 2023, p. 1-p. 8.

"International Search Report (Form PCT/ISA/210) of PCT/JP2020/022508," mailed on Aug. 18, 2020, with English translation thereof, pp. 1-5.

"Written Opinion of the International Searching Authority (Form PCT/ISA/237)" of PCT/JP2020/022508, mailed on Aug. 18, 2020, with English translation thereof, pp. 1-6.

"Office Action of China Counterpart Application", issued on Mar. 17, 2025, with English translation thereof, p. 1-p. 17.

* cited by examiner

POLYMER-BASED PIEZOELECTRIC COMPOSITE MATERIAL AND PIEZOELECTRIC FILM

CROSS-REFERENCE TO RELATED APPLICATIONS

This application is a Continuation of PCT International Application No. PCT/JP2020/022508 filed on Jun. 8, 2020, which claims priority under 35 U.S.C. § 119(a) to Japanese Patent Application No. 2019-121255 filed on Jun. 28, 2019. The above application is hereby expressly incorporated by reference, in its entirety, into the present application.

BACKGROUND OF THE INVENTION

1. Field of the Invention

The present invention relates to a polymer-based piezoelectric composite material and a piezoelectric film formed of the polymer-based piezoelectric composite material.

2. Description of the Related Art

With reduction in thickness of displays such as liquid crystal displays or organic EL displays, speakers used in these thin displays are also required to be lighter and thinner. Further, in flexible displays having flexibility, speakers are also required to have flexibility in order to be integrated with flexible displays without impairing lightness and flexibility. As such lightweight, thin, and flexible speakers, it is considered to employ sheet-like piezoelectric films having a property of stretching and contracting in response to an applied voltage.

It has been suggested to use a piezoelectric composite material obtained by dispersing piezoelectric particles in a matrix for such a sheet-like piezoelectric film having flexibility.

For example, JP2014-014063A describes an electroacoustic conversion film including a polymer-based piezoelectric composite material obtained by dispersing piezoelectric particles in a viscoelastic matrix consisting of a polymer material having a viscoelasticity at room temperature, thin film electrodes formed on both surfaces of the polymer-based piezoelectric composite material, and a protective layer formed on a surface of the thin film electrode.

SUMMARY OF THE INVENTION

Based on the examination conducted by the present inventors, it was found that in a case where a piezoelectric film formed of a polymer-based piezoelectric composite material obtained by dispersing piezoelectric particles in a matrix is used as a speaker, there is a problem in that the sound pressure changes depending on the humidity of the atmosphere.

Specifically, both surfaces of the polymer-based piezoelectric composite material in the piezoelectric film are covered with an electrode layer, but the end surface is exposed. Therefore, moisture is adsorbed on the end surface of the polymer-based piezoelectric composite material. In a case where moisture is adsorbed on the polymer-based piezoelectric composite material, the relative dielectric constant of the polymer-based piezoelectric composite material (matrix) changes, and thus the piezoelectric conversion efficiency changes. Therefore, it was found that the piezoelectric conversion efficiency changes in a case where the amount of moisture adsorbed on the polymer-based piezoelectric composite material changes depending on the humidity of the atmosphere.

The present invention has been made to solve such problems of the related art, and an object thereof is to provide a polymer-based piezoelectric composite material and a piezoelectric film having piezoelectric conversion characteristics stabilized by suppressing a change in piezoelectric conversion efficiency in various humidity environments.

In order to achieve the above-described object, the present invention has the following configurations.

[1] A polymer-based piezoelectric composite material comprising: piezoelectric particles in a matrix containing a polymer material, in which a pore volume per unit area is in a range of 0.01 µL/mm$^2$ to 1.7 µL/mm$^2$, which is acquired in a manner that a mercury penetration amount of a sample obtained by cutting a polymer-based piezoelectric composite material in a thickness direction and cutting out the polymer-based piezoelectric composite material into a size of 12.5 mm×25 mm is measured by a mercury penetration method, and the penetration amount is divided by an area of a cross-section of the sample.

[2] The polymer-based piezoelectric composite material according to [1], in which the polymer-based piezoelectric composite material is polarized in the thickness direction.

[3] The polymer-based piezoelectric composite material according to [1] or [2], in which piezoelectric characteristics do not include in-plane anisotropy.

[4] The polymer-based piezoelectric composite material according to any one of [1] to [3], in which the polymer material has a viscoelasticity at room temperature.

[5] A piezoelectric film comprising: a polymer-based piezoelectric composite material which contains piezoelectric particles in a matrix containing a polymer material; and an electrode layer which is formed on each of both surfaces of the polymer-based piezoelectric composite material, in which a pore volume per unit area is in a range of 0.01 µL/mm$^2$ to 1.7 µL/mm$^2$, which is acquired in a manner that a mercury penetration amount of a sample obtained by cutting a piezoelectric film in a thickness direction and cutting out the piezoelectric film into a size of 12.5 mm×25 mm is measured by a mercury penetration method, and the penetration amount is divided by an area of a cross-section of the polymer-based piezoelectric composite material of the sample.

[6] The piezoelectric film according to [5], further comprising: a protective layer laminated on a surface of the electrode layer opposite to a surface on the polymer-based piezoelectric composite material side.

[7] The piezoelectric film according to [5] or [6], in which the polymer-based piezoelectric composite material is polarized in the thickness direction.

[8] The piezoelectric film according to any one of [5] to [7], in which piezoelectric characteristics do not include in-plane anisotropy.

[9] The piezoelectric film according to any one of [5] to [8], in which the polymer material has a viscoelasticity at room temperature.

According to the present invention, it is possible to provide a polymer-based piezoelectric composite material and a piezoelectric film having piezoelectric conversion characteristics stabilized by suppressing a change in piezoelectric conversion efficiency in various humidity environments.

DESCRIPTION OF THE PREFERRED EMBODIMENTS

Hereinafter, a polymer-based piezoelectric composite material and a piezoelectric film of the present invention will be described in detail based on the suitable examples shown in the accompanying drawings.

Descriptions of the constituent requirements described below may be made based on representative embodiments of the present invention, but the present invention is not limited to such embodiments.

In the present specification, a numerical range shown using "to" indicates a range including numerical values described before and after "to" as a lower limit and an upper limit.

The polymer-based piezoelectric composite material according to the embodiment of the present invention is a polymer-based piezoelectric composite material containing piezoelectric particles in a matrix that contains a polymer material, in which a pore volume per unit area is in a range of 0.01 $\mu L/mm^2$ to 1.7 $\mu L/mm^2$, which is acquired in a manner that a mercury penetration amount of a sample obtained by cutting a polymer-based piezoelectric composite material in a thickness direction and cutting out the polymer-based piezoelectric composite material into a size of 12.5 mm×25 mm is measured by a mercury penetration method, and the penetration amount is divided by an area of a cross-section of the sample.

Further, the piezoelectric film according to the embodiment of the present invention is a piezoelectric film containing a polymer-based piezoelectric composite material which contains piezoelectric particles in a matrix containing a polymer material, and an electrode layer which is formed on each of both surfaces of the polymer-based piezoelectric composite material, in which a pore volume per unit area is is in a range of 0.01 $\mu L/mm^2$ to 1.7 $\mu L/mm^2$, which is acquired in a manner that a mercury penetration amount of a sample obtained by cutting a piezoelectric film in a thickness direction and cutting out the piezoelectric film into a size of 12.5 mm×25 mm is measured by a mercury penetration method, and the penetration amount is divided by an area of a cross-section of the polymer-based piezoelectric composite material of the sample.

[Piezoelectric Film]

Figure 1:
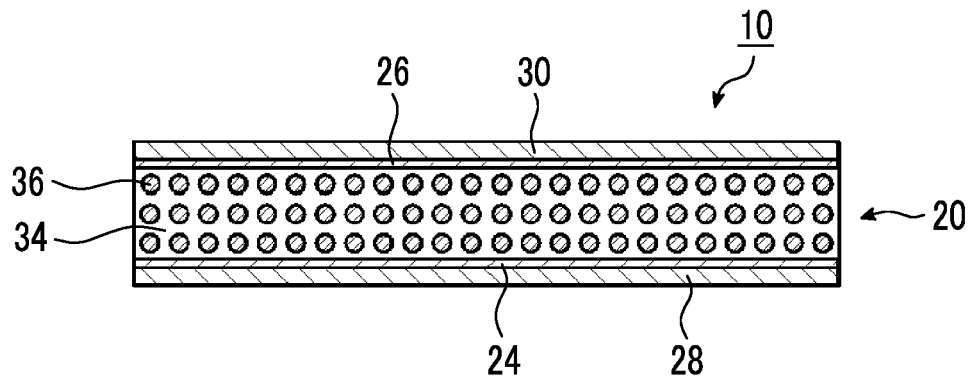
FIG. 1 is a conceptual view illustrating an example of a piezoelectric film including a polymer-based piezoelectric composite material of the present invention.

FIG. 1 is a cross-sectional view conceptually illustrating an example of the piezoelectric film according to the embodiment of the present invention which includes the polymer-based piezoelectric composite material according to the embodiment of the present invention.

As illustrated in FIG. 1, a piezoelectric film 10 includes a piezoelectric layer 20 which is a sheet-like material having piezoelectric properties, a lower electrode 24 laminated on one surface of the piezoelectric layer 20, a lower protective layer 28 laminated on the lower electrode 24, an upper electrode 26 laminated on the other surface of the piezoelectric layer 20, and an upper protective layer 30 laminated on the upper electrode 26.

The piezoelectric layer 20 is formed by dispersing piezoelectric particles 36 in a matrix 34 containing a polymer material. That is, the piezoelectric layer 20 is a polymer-based piezoelectric composite material according to the embodiment of the present invention. Further, the lower electrode 24 and the upper electrode 26 are electrode layers in the present invention. Further, the lower protective layer 28 and the upper protective layer 30 are protective layers in the present invention.

As will be described later, the piezoelectric film 10 (piezoelectric layer 20) is polarized in the thickness direction as a preferred embodiment.

Such a piezoelectric film 10 can be suitably used as, for example, various sensors such as sonic sensors, ultrasonic sensors, pressure sensors, tactile sensors, strain sensors, and vibration sensors, acoustic devices such as microphones, pickups, speakers, and exciters (specific applications thereof include noise cancellers (used for cars, trains, airplanes, and robots), artificial voice cords, buzzers for preventing invasion of pests and harmful animals, furniture, wallpaper, photos, helmets, goggles, signage, and robots), haptics used for automobiles, smartphones, smart watch, and games, ultrasonic converters such as ultrasonic probes and hydrophones, actuators used for preventing adhesion of water droplets, transportation, stirring, dispersion, and polishing, damping materials (dampers) used for sports equipment such as containers, vehicles, buildings, skis, and rackets, and vibration power generators used by being applied to roads, floors, mattresses, chairs, shoes, tires, wheels, and computer keyboards.

[Polymer-Based Piezoelectric Composite Material (Piezoelectric Layer)]

The piezoelectric layer 20 which is the polymer-based piezoelectric composite material according to the embodiment of the present invention is obtained by dispersing the piezoelectric particles 36 in the matrix 34.

Further, in the polymer-based piezoelectric composite material, the pore volume acquired by cutting out a sample according to the mercury penetration method is in a range of 0.01 $\mu L/mm^2$ to 1.7 $\mu L/mm^2$. This point will be described in detail later.

As the material of the matrix 34 (serving as a matrix and a binder) of the polymer-based piezoelectric composite material constituting the piezoelectric layer 20, a polymer material having a viscoelasticity at room temperature is preferably used.

The piezoelectric film 10 according to the embodiment of the present invention is suitably used for a speaker having flexibility such as a speaker for a flexible display. Here, it is preferable that the polymer-based piezoelectric composite material (piezoelectric layer 20) used for a speaker having flexibility satisfies the following requirements. Therefore, it is preferable to use a polymer material having a viscoelasticity at room temperature as a material satisfying the following requirements.

Further, in the present specification, the "room temperature" indicates a temperature range of approximately 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a matrix and piezoelectric particles, which may lead to breakage. Accordingly, the polymer-based piezoelectric composite material is required to have suitable flexibility. In addition, in a case where strain energy is diffused into the outside as heat, the stress is able to be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire polymer-based piezoelectric composite material (piezoelectric film) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency is changed in association with a change in the curvature of the speaker decreases. Therefore, the loss tangent of the polymer-based piezoelectric composite material is required to be suitably large.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 20), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature as a matrix. In particular, from the viewpoint that such a behavior is suitably exhibited, it is preferable that a polymer material in which the glass transition temperature at a frequency of 1 Hz is at room temperature, that is, in a range of 0° C. to 50° C. is used for a matrix of the polymer-based piezoelectric composite material.

As the polymer material having a viscoelasticity at room temperature, various known materials are able to be used as long as the materials have dielectric properties. It is preferable that a polymer material in which the maximal value of a loss tangent at a frequency of 1 Hz according to a dynamic viscoelasticity test at room temperature, that is, in a range of 0° C. to 50° is 0.5 or greater is used as the polymer material.

In this manner, in a case where the polymer-based piezoelectric composite material is slowly bent due to an external force, stress concentration on the interface between the matrix and the piezoelectric particles at the maximum bending moment portion is relieved, and thus satisfactory flexibility is obtained.

In the polymer material, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, the relative dielectric constant of the polymer material is 10 or greater at 25° C. Accordingly, in a case where a voltage is applied to the polymer-based piezoelectric composite material, a higher electric field is applied to the piezoelectric particles in the matrix, and thus a large deformation amount is able to be expected.

However, in consideration of ensuring satisfactory moisture resistance and the like, it is suitable that the relative dielectric constant of the polymer material is 10 or less at 25° C.

Examples of the polymer material satisfying such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate. In addition, as these polymer materials, a commercially available product such as Hybrar 5127 (manufactured by Kuraray Co., Ltd.) is also able to be suitably used. Among these, it is preferable to use a material containing a cyanoethyl group and particularly preferable to use cyanoethylated as the polymer material.

Further, these polymer materials may be used alone or in combination (mixture) of a plurality of kinds thereof.

In the matrix 34 for which such a polymer material is used, a plurality of polymer materials may be used in combination as necessary.

That is, for the purpose of adjusting dielectric characteristics, mechanical characteristics, and the like, other dielectric polymer materials may be added to the matrix 34 in addition to the polymer material having a viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the matrix 34 of the piezoelectric layer 20, the number of kinds of the dielectric polymer materials to be added in addition to the polymer material having a viscoelasticity at room temperature such as cyanoethylated PVA is not limited to one, and a plurality of kinds of the materials may be added.

In addition, for the purpose of controlling the glass transition point, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, or mica may be added to the matrix 34 in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the matrix 34 of the piezoelectric layer 20, the addition amount in a case of adding materials other than the polymer material having a viscoelasticity such as cyanoethylated PVA is not particularly limited, but is preferably set to 30% by mass or less in terms of the proportion of the materials in the matrix 34.

In this manner, the characteristics of the polymer material to be added can be exhibited without impairing the viscoelastic relieving mechanism in the matrix 34, and thus preferable results, for example, an increase in the dielectric constant, improvement of the heat resistant, and improvement of the adhesiveness between the piezoelectric particles 36 and the electrode layer can be obtained.

The piezoelectric layer 20 is a polymer-based piezoelectric composite material in which the piezoelectric particles 36 are dispersed in the matrix 34.

The piezoelectric particles 36 consist of ceramic particles having a perovskite type or wurtzite type crystal structure.

As the ceramic particles forming the piezoelectric particles 36, for example, lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$) are exemplified.

Only one of these piezoelectric particles 36 may be used, or a plurality of types thereof may be used in combination (mixture).

The particle diameter of such piezoelectric particles 36 is not limited, and may be appropriately selected depending on the size, the applications, and the like of the polymer-based piezoelectric composite material (piezoelectric film 10).

The particle diameter of the piezoelectric particles 36 is preferably in a range of 1 to 10 μm. By setting the particle diameter of the piezoelectric particles 36 to be in the above-described range, preferable results in terms of achieving both excellent piezoelectric characteristics and flexibility of the polymer-based piezoelectric composite material (piezoelectric film 10) can be obtained.

In FIG. 1, the piezoelectric particles 36 in the piezoelectric layer 20 are uniformly dispersed in the matrix 34 with regularity, but the present invention is not limited thereto.

That is, the piezoelectric particles 36 in the piezoelectric layer 20 may be irregularly dispersed in the matrix 34 as long as the piezoelectric particles 36 are preferably uniformly dispersed therein.

In the piezoelectric layer 20 (polymer-based piezoelectric composite material), the ratio between the amount of the matrix 34 and the amount of the piezoelectric particles 36 in the piezoelectric layer 20 is not limited, and the ratio thereof may be appropriately set according to the size and the thickness of the piezoelectric layer 20 in the plane direction, the applications of the polymer-based piezoelectric composite material, the characteristics required for the polymer-based piezoelectric composite material, and the like.

The volume fraction of the piezoelectric particles 36 in the piezoelectric layer 20 is preferably in a range of 30% to 80%, more preferably 50% or greater, and still more preferably in a range of 50% to 80%.

By setting the ratio between the amount of the matrix 34 and the amount of the piezoelectric particles 36 to be in the above-described range, preferable results in terms of achieving both of excellent piezoelectric characteristics and flexibility can be obtained.

The thickness of the piezoelectric layer 20 is not limited, and may be appropriately set according to the applications of the polymer-based piezoelectric composite material, the characteristics required for the polymer-based piezoelectric composite material, and the like. It is advantageous that the thickness of the piezoelectric layer 20 increases in terms of the rigidity such as the strength of stiffness of a so-called sheet-like material, but the voltage (potential difference) required to stretch and contract the piezoelectric layer 20 by the same amount increases.

The thickness of the piezoelectric layer 20 is preferably in a range of 10 to 300 μm, more preferably in a range of 20 to 200 μm, and still more preferably in a range of 30 to 150 μm.

By setting the thickness of the piezoelectric layer 20 to be in the above-described range, preferable results in terms of achieving both ensuring of the rigidity and moderate elasticity can be obtained.

[Electrode Layer and Protective Layer]

As illustrated in FIG. 1, the piezoelectric film 10 of the illustrated example has a configuration in which the lower electrode 24 is provided on one surface of the piezoelectric layer 20, the lower protective layer 28 is provided on the surface thereof, the upper electrode 26 is provided on the other surface of the piezoelectric layer 20, and the upper protective layer 30 is provided on the surface thereof. Here, the upper electrode 26 and the lower electrode 24 form an electrode pair.

In addition to these layers, the piezoelectric film 10 includes an electrode lead portion that leads out the electrodes from the upper electrode 26 and the lower electrode 24, and the electrode lead portion is connected to a power source. Further, the piezoelectric film 10 may have an insulating layer which covers a region where the piezoelectric layer 20 is exposed for preventing a short circuit or the like.

That is, the piezoelectric film 10 has a configuration in which both surfaces of the piezoelectric layer 20 are interposed between the electrode pair, that is, the upper electrode 26 and the lower electrode 24 and the laminate is further interposed between the lower protective layer 28 and the upper protective layer 30.

As described above, in the piezoelectric film 10, the region interposed between the upper electrode 26 and the lower electrode 24 is stretched and contracted according to an applied voltage.

In the piezoelectric film 10, the lower protective layer 28 and the upper protective layer 30 are provided as a preferred embodiment rather than essential constituent requirements.

The lower protective layer 28 and the upper protective layer 30 have a function of covering the upper electrode 26 and the lower electrode 24 and applying moderate rigidity and mechanical strength to the piezoelectric layer 20. That is, the piezoelectric layer 20 consisting of the matrix 34 and the piezoelectric particles 36 in the piezoelectric film 10 exhibits extremely excellent flexibility under bending deformation at a slow vibration, but may have insufficient rigidity or mechanical strength depending on the applications. As a compensation for this, the piezoelectric film 10 is provided with the lower protective layer 28 and the upper protective layer 30.

The lower protective layer 28 and the upper protective layer 30 are not limited, and various sheet-like materials can be used, and suitable examples thereof include various resin films.

Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyethylene naphthalate (PEN), triacetyl cellulose (TAC), and a cyclic olefin-based resin is suitably used.

The thickness of the lower protective layer 28 or the upper protective layer 30 is not limited. In addition, the thicknesses of the lower protective layer 28 and the upper protective layer 30 are basically the same as each other, but may be different from each other.

Here, in a case where the rigidity of the lower protective layer 28 and the upper protective layer 30 is extremely high, not only is the stretch and contraction of the piezoelectric layer 20 constrained, but also the flexibility is impaired. Therefore, it is advantageous that the thickness of the lower protective layer 28 and the thickness of the upper protective layer 30 decrease except for the case where the mechanical strength or excellent handleability as a sheet-like material is required.

In a case where the thickness of the lower protective layer 28 and the upper protective layer 30 in the piezoelectric film 10 is two times or less the thickness of the piezoelectric layer 20, preferable results in terms of achieving both ensuring of the rigidity and moderate elasticity can be obtained.

For example, in a case where the thickness of the piezoelectric layer 20 is 50 µm and the lower protective layer 28 and the upper protective layer 30 consist of PET, the thickness of the lower protective layer 28 and the upper protective layer 30 is preferably 100 µm or less, more preferably 50 µm or less, and still more preferably 25 µm or less.

In the piezoelectric film 10, the lower electrode 24 is formed between the piezoelectric layer 20 and the lower protective layer 28, and the upper electrode 26 is formed between the piezoelectric layer 20 and the upper protective layer 30.

The lower electrode 24 and the upper electrode 26 are provided to apply a driving voltage to the piezoelectric layer 20.

In the present invention, the material for forming the lower electrode 24 and the upper electrode 26 is not limited, and various conductors can be used as the material. Specific examples thereof include carbon, palladium, iron, tin, aluminum, nickel, platinum, gold, silver, copper, titanium, chromium, and molybdenum, alloys thereof, laminates and composites of these metals and alloys, and indium tin oxide. Among these, copper, aluminum, gold, silver, platinum, and indium-tin oxide are suitably as the lower electrode 24 and the upper electrode 26.

In addition, the method of forming the lower electrode 24 and the upper electrode 26 is not limited, and various known methods such as a vapor-phase deposition method (a vacuum film forming method) such as vacuum vapor deposition or sputtering, film formation using plating, and a method of bonding a foil formed of the materials described above can be used.

Among these, particularly from the viewpoint of ensuring the flexibility of the piezoelectric film 10, a thin film made of copper, aluminum, or the like formed by vacuum vapor deposition is suitably used as the lower electrode 24 and the upper electrode 26. Among these, particularly a thin film made of copper formed by vacuum vapor deposition is suitably used.

The thickness of the lower electrode 24 and the upper electrode 26 is not limited. In addition, the thicknesses of the lower electrode 24 and the upper electrode 26 are basically the same as each other, but may be different from each other.

Here, similarly to the lower protective layer 28 and upper protective layer 30 described above, in a case where the rigidity of the lower electrode 24 and the upper electrode 26 is extremely high, not only is the stretch and contraction of the piezoelectric layer 20 constrained, but also the flexibility is impaired. Therefore, it is advantageous that the thicknesses of the lower electrode 24 and the upper electrode 26 decrease in a case where the electrical resistance is not excessively high. That is, it is preferable that the lower electrode 24 and the upper electrode 26 are thin film electrodes.

It is suitable that the product of the thicknesses of the lower electrode 24 and the upper electrode 26 of the piezoelectric film 10 and the Young's modulus is less than the product of the thicknesses of the lower protective layer 28 and the upper protective layer 30 and the Young's modulus because the flexibility is not considerably impaired.

For example, in a case of a combination consisting of the lower protective layer 28 and the upper protective layer 30 formed of PET (Young's modulus: approximately 6.2 GPa) and the lower electrode 24 and the upper electrode 26 formed of copper (Young's modulus: approximately 130 GPa), the thickness of the lower electrode 24 and the upper electrode 26 is preferably 1.2 µm or less, more preferably 0.3 µm or less, and still more preferably 0.1 µm or less in a case of assuming that the thickness of the lower protective layer 28 and the upper protective layer 30 is 25 µm.

It is preferable that, in the piezoelectric film 10, the maximal value of the loss tangent (tan δ) at a frequency of 1 Hz according to dynamic viscoelasticity measurement is present at room temperature and more preferable that the maximal value at which the loss tangent is 0.1 or greater is present at room temperature.

In this manner, even in a case where the piezoelectric film 10 is subjected to bending deformation at a slow vibration of less than or equal to a few Hz from the outside, since the strain energy can be effectively diffused to the outside as heat, occurrence of cracks on the interface between the matrix and the piezoelectric particle can be prevented.

In the piezoelectric film 10, it is preferable that the storage elastic modulus (E') at a frequency of 1 Hz according to the dynamic viscoelasticity measurement is in a range of 10 GPa to 30 GPa at 0° C. and in a range of 1 GPa to 10 GPa at 50° C. The same applies to the conditions for the piezoelectric layer 20.

In this manner, the piezoelectric film 10 may have large frequency dispersion in the storage elastic modulus (E'). That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus at a frequency of 1 Hz according to the dynamic viscoelasticity measurement is in a range of $1.0 \times 10^5$ to $2.0 \times 10^6$ (1.0E+05 to 2.0E+06) N/m at 0° C. and in a range of $1.0 \times 10^5$ to $1.0 \times 10^6$ (1.0E+05 to 1.0E+06) N/m at 50° C. The same applies to the conditions for the piezoelectric layer 20.

In this manner, the piezoelectric film 10 may have moderate rigidity and mechanical strength within a range not impairing the flexibility and the acoustic characteristics.

Further, in the piezoelectric film 10, it is preferable that the loss tangent at a frequency of 1 kHz at 25° C. is 0.05 or greater in a master curve obtained from the dynamic viscoelasticity measurement. The same applies to the conditions for the piezoelectric layer 20.

In this manner, the frequency of a speaker using the piezoelectric film 10 is smooth as the frequency characteristic thereof, and thus a change in acoustic quality in a case where the lowest resonance frequency $f_0$ is changed according to a change in the curvature of the speaker can be decreased.

In the present invention, the storage elastic modulus (Young's modulus) and the loss tangent of the piezoelectric film 10, the piezoelectric layer 20, and the like may be measured by a known method. As an example, the measurement may be performed using a dynamic viscoelasticity measuring device DMS6100 (manufactured by SII Nanotechnology Inc.).

Examples of the measurement conditions include a measurement frequency of 0.1 Hz to 20 Hz (0.1 Hz, 0.2 Hz, 0.5 Hz, 1 Hz, 2 Hz, 5 Hz, 10 Hz, and 20 Hz), a measurement temperature of −50° C. to 150° C., a temperature rising rate of 2° C./min (in a nitrogen atmosphere), a sample size of 40 mm×10 mm (including the clamped region), and a chuck-to-chuck distance of 20 mm.

Here, in the present invention, the pore volume measured by the mercury penetration method in a cross section of the polymer-based piezoelectric composite material is in a range of 0.01 µL/mm² to 1.7 µL/mm² per unit cross-sectional area.

The pore volume per unit area measured by the mercury penetration method in a cross section of the polymer-based piezoelectric composite material (hereinafter, also referred to as the pore volume of the polymer-based piezoelectric composite material per unit area) is a value acquired by measuring a mercury penetration amount of a sample obtained by cutting the piezoelectric film in the thickness direction and cutting out the piezoelectric film into a size of 12.5 mm×25 mm according to a mercury penetration method and dividing the penetration amount by the area of a cross-section of the sample. Since the sample for measuring the mercury penetration amount using the mercury penetration method is in a state where electrode layers are laminated on both main surfaces of the polymer-based piezoelectric composite material, and thus both main surfaces are in a state of being sealed by the electrode layers. Therefore, the mercury penetration amount to be measured by the mercury penetration method is the penetration amount of mercury to be injected into the polymer-based piezoelectric composite material in the cross section of the sample.

As described above, based on the examination of the present inventors, it was found that in a case where a piezoelectric film formed of a polymer-based piezoelectric composite material obtained by dispersing piezoelectric particles in a matrix is used as a speaker, there is a problem in that the sound pressure changes depending on the humidity of the atmosphere.

Both surfaces of the polymer-based piezoelectric composite material in the piezoelectric film are covered with an electrode layer, but the end surface is exposed. Therefore, the moisture present in the atmosphere is adsorbed on the end surface of the polymer-based piezoelectric composite material. In the polymer material used as the matrix of the polymer-based piezoelectric composite material, the glass transition point at a frequency of 1 Hz is changed by the moisture content. Further, the relative dielectric constant of the polymer material is the maximum near the glass transition point. Therefore, for example, in a case where the humidity of the atmosphere increases, the amount of moisture to be adsorbed on the polymer-based piezoelectric composite material increases, and the glass transition point of the polymer material serving as a matrix is decreased. Along with this, apparently, for example, the relative dielectric constant of the polymer material at room temperature increases. In a case where the relative dielectric constant of the polymer material increases, since a higher electric field is applied to the piezoelectric particles in the matrix in a case where a voltage is applied to the polymer-based piezoelectric composite material, deformation can be more greatly made. That is, the piezoelectric conversion efficiency of the piezoelectric film increases.

In this manner, in the piezoelectric film formed of the polymer-based piezoelectric composite material obtained by dispersing piezoelectric particles in a matrix, the piezoelectric conversion efficiency of the piezoelectric film changes due to the adsorption of moisture on the polymer-based piezoelectric composite material, and thus the sound pressure changes depending on the humidity of the atmosphere.

Here, based on further examination conducted by the present inventors, it was found that the end surface of the polymer-based piezoelectric composite material has recesses (pores) and the influence of the humidity of the atmosphere varies depending on the size and number of the pores.

Figure 2:
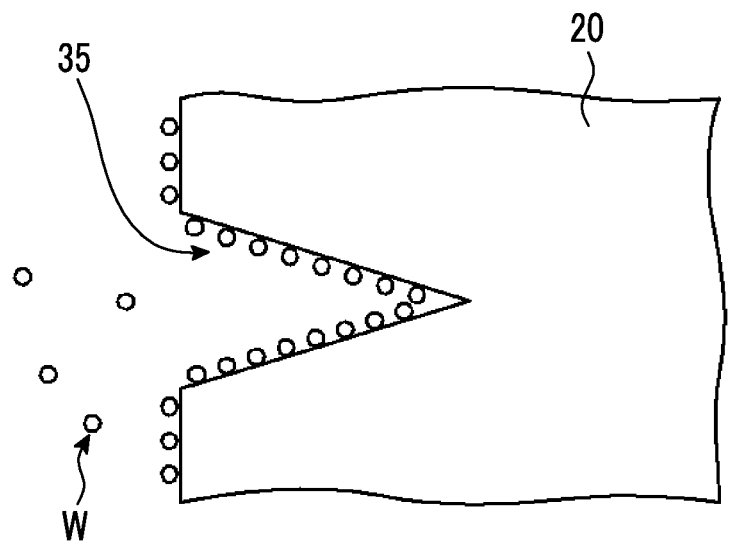
FIG. 2 is an enlarged cross-sectional view illustrating the polymer-based piezoelectric composite material.

Specifically, as illustrated in FIG. 2, in a case where the end surface of the polymer-based piezoelectric composite material (piezoelectric layer 20) has pores 35, the actual surface area of the end surface of the polymer-based piezoelectric composite material, that is, the area exposed to the outside (the area of the interface with the atmosphere) is large, and thus the amount of moisture W to be adsorbed increases. Further, in a case where the humidity of the atmosphere is low, the moisture in the polymer-based piezoelectric composite material is likely to evaporate in a case where the actual surface area of the end surface of the polymer-based piezoelectric composite material, that is, the area of the interface with the atmosphere is large. Therefore, the adsorption and evaporation of the moisture W are likely to occur and the change in the piezoelectric conversion efficiency of the piezoelectric film due to the change in the content of moisture is likely to occur as the actual surface area of the end surface of the polymer-based piezoelectric composite material increases.

On the contrary, in the piezoelectric film according to the embodiment of the present invention, the actual surface area of the end surface of the polymer-based piezoelectric composite material, that is, the area of the interface with the atmosphere is decreased and the adsorption and evaporation of moisture on the end surface of the polymer-based piezoelectric composite material are unlikely to occur in a case where the pore volume of the polymer-based piezoelectric composite material per unit area is set to be in a range of 0.01 $\mu L/mm^2$ to 1.7 $\mu L/mm^2$, and thus the change in the piezoelectric conversion efficiency of the piezoelectric film due to the change in the content of moisture in the polymer-based piezoelectric composite material can be suppressed.

Here, in the polymer-based piezoelectric composite material obtained by dispersing the piezoelectric particles in the matrix, air bubbles are mixed inside in the production process thereof, and complete removal of the air bubbles is unlikely to be made. In general, the piezoelectric film is used to form each of the electrode layers and the polymer-based piezoelectric composite material, cut into a desired shape, and provided for various applications as a piezoelectric film. Therefore, the air bubble portions on the cut surface appear as recesses (pores) on the end surface of the polymer-based piezoelectric composite material of the cut piezoelectric film.

In the present invention, the volume of the pores on the end surface of the polymer-based piezoelectric composite material due to such air bubbles is in a range of 0.01 $\mu L/mm^2$ to 1.7 $\mu L/mm^2$ per unit area.

As described above, the pore volume of the polymer-based piezoelectric composite material per unit area is measured using a cut-out sample. However, as described above, since the end surface of the polymer-based piezoelectric composite material is a cut surface, the pore volume on the end surface of the composite piezoelectric material per unit area is basically the same as the pore volume per unit area measured using the sample.

From the viewpoint of decreasing the actual surface area of the end surface of the polymer-based piezoelectric composite material and suppressing the change in piezoelectric conversion efficiency of the piezoelectric film due to change in humidity of the atmosphere, the pore volume of the polymer-based piezoelectric composite material per unit area is preferably in a range of 0.05 $\mu L/mm^2$ to 1.7 $\mu L/mm^2$, more preferably in a range of 0.05 $\mu L/mm^2$ to 0.6 $\mu L/mm^2$, and still more preferably in a range of 0.05 $\mu L/mm^2$ to 0.3 $\mu L/mm^2$.

Further, since the pores on the end surface of the polymer-based piezoelectric composite material are caused by air bubbles, the volume of the air bubbles corresponds to the pore volume of the polymer-based piezoelectric composite material per unit area.

Since the air bubbles in the polymer-based piezoelectric composite material act as a path for moisture, the moisture attached to the polymer-based piezoelectric composite material is more likely to enter the polymer-based piezoelectric composite material in a case where the volume of the air bubbles is large. On the contrary, in the present invention, by setting the pore volume of the polymer-based piezoelectric composite material per unit area is set to be in a range of 0.01 $\mu L/mm^2$ to 1.7 $\mu L/mm^2$, the volume of the air bubbles in the polymer-based piezoelectric composite material can also be reduced, and thus entering of the moisture into the polymer-based piezoelectric composite material can be suppressed.

A method of measuring the pore volume of the polymer-based piezoelectric composite material per unit area will be described in more detail.

(Cutting Out of Sample)

First, samples are cut out from the piezoelectric film.

The samples are formed by cutting the piezoelectric film in the thickness direction and cutting out the piezoelectric film to have a size of 12.5 mm×25 mm.

Further, in a case where the piezoelectric film has a layer other than the electrode layer such as a protective layer, a sample having a protective layer is used. That is, a sample in which both surfaces of the polymer-based piezoelectric composite material are provided with an electrode layer is used as the sample.

The cut-out samples are weighed and the number of samples is adjusted such that the total mass of the samples is in a range of 1.2 g to 1.5 g. Further, the samples are not subjected to a pretreatment for vacuum exhaust.

(Measurement of Mercury Penetration Amount)

The samples are placed in a cell container of a pore distribution measuring device AUTOPORE IV 9520 (Shimadzu Corporation/Micromeritics Instrument Corporation), and the mercury penetration amount is measured.

As the cell, a 5 cc large piece cell (stem volume of 0.4 cc) is used.

Figure 10:
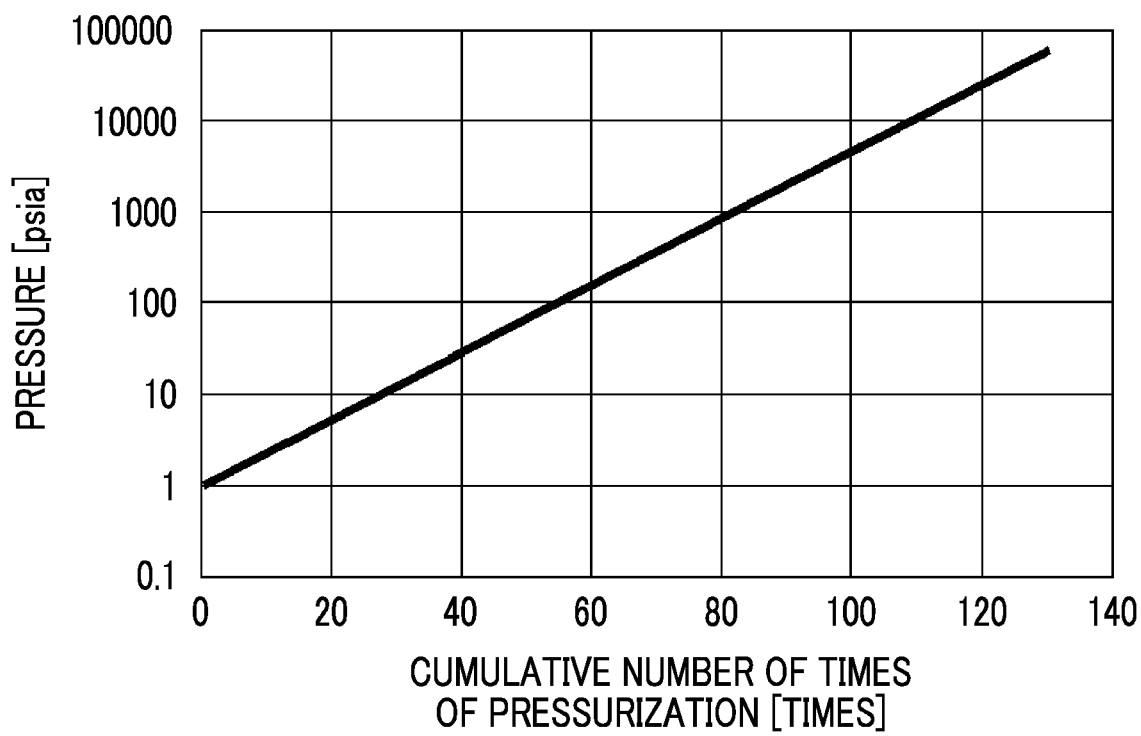
FIG. 10 is a graph showing the relationship between the cumulative number of times of pressurization and the pressure.

The measurement pressure is set such that the initial pressure is approximately 7 kPa (1.0 psia (corresponding to a pore diameter of approximately 180 $\mu$m)) and the maximum pressure is approximately 400 MPa (60000 psia). In this pressure range, for example, the pressure is applied a plurality of times under the conditions shown in FIG. 10. In a case where the pressure is stabilized at a certain pressure value for 10 seconds, the pressure is applied under a condition of the next pressure value.

As the analysis software, AutoPore IV 9500 version 1.09 is used. Further, the physical property values of mercury used for the calculation are set to a mercury contact angle of 130.0 degrees and a mercury surface tension of 485.0 dynes/cm. The blank correction is not used.

The pore distribution is measured under the above-described conditions.

Based on the result of the measured pore distribution, the mercury penetration amount is calculated in the following manner.

The mercury penetration amount is calculated in a pore diameter range of 0.1 $\mu$m to 10 $\mu$m. That is, the mercury penetration amount (unit: $\mu L/g$) per 1 g of the sample is acquired by subtracting the integrated value of the mercury penetration amount in a pore diameter of 10 $\mu$m (pressure of approximately 17 psia) from the integrated value of the mercury penetration amount in a pore diameter of 0.1 $\mu$m (pressure of approximately 1700 psia).

The mercury penetration amount ($\mu$L) is acquired by multiplying the mercury penetration amount ($\mu$L/g) per 1 g of the obtained sample by the mass of the sample.

(Calculation of Cross-Sectional Area of Polymer-Based Piezoelectric Composite Material in Sample)

The total exposed area of the polymer-based piezoelectric composite material, that is, the total cross-sectional area in the sample for which the mercury penetration amount has been acquired is acquired in the following manner.

First, a method of measuring the thickness of the polymer-based piezoelectric composite layer in the cross section of the polymer-based piezoelectric composite material is as follows.

The polymer-based piezoelectric composite material is cut in the thickness direction to observe the cross section of the polymer-based piezoelectric composite material. The polymer-based piezoelectric composite material is cut by mounting a histo knife blade (manufactured by Drukker) having a width of 8 mm on RM2265 (manufactured by Leica Biosystems) and setting the speed to a controller scale of 1 and an engagement amount of 0.25 µm to 1 µm. The cross section thereof is observed with a scanning electron microscope (SEM) (for example, SU8220, manufactured by Hitachi High-Tech Corporation). The sample is conductively treated by Pt vapor deposition, and the work distance is set to 3 mm. The observation is made under conditions of an SE image (Upper) and an acceleration voltage of 0.5 kV, a sharp image is output by focus adjustment and astigmatism adjustment, and automatic brightness adjustment (auto setting, brightness: 0, contrast: 0) is carried out in a state where the polymer-based piezoelectric composite material portion covers the entire screen. The photographing magnification is set as the magnification in which the electrodes at both ends fit on one screen and the width between the electrodes is at least half of the screen.

The length between the two electrode layers laminated on both surfaces of the polymer-based piezoelectric composite material is acquired from the SEM image and used as the thickness of the polymer-based piezoelectric composite material. The same applies to optional ten cross sections, and the average value of the distances between the electrodes is employed as the thickness of the polymer composite piezoelectric layer.

The total exposed area of the polymer-based piezoelectric composite layer is acquired by multiplying the acquired thickness of the polymer-based piezoelectric composite material by the total width of the polymer-based piezoelectric composite material in the cross section of the sample, that is, "(12.5 mm+25 mm)×2×number of sheets of samples".

(Calculation of Pore Volume Per Unit Volume)

The pore volume (µL/mm$^2$) per unit area is acquired by dividing the mercury penetration amount (µL) acquired in the above-described manner by the area (mm$^2$) of the cross section of the polymer-based piezoelectric composite material.

Further, in a case of a single polymer-based piezoelectric composite material, the pore volume per unit area may be acquired in the same manner as described above using a sample cut out by masking both main surfaces of the polymer-based piezoelectric composite material.

It is preferable that the masking of both main surfaces of the polymer-based piezoelectric composite material is performed with a metal layer used as an electrode layer such as copper foil. That is, it is preferable that the pore volume per unit area is acquired by setting the form of the sample even in a case of the polymer-based piezoelectric composite material to be the same as the form of the sample in a case of the piezoelectric film.

Examples of the method of adjusting the pore volume of the polymer-based piezoelectric composite material per unit area include a method of eliminating air bubbles that cause pores by performing a line mixing treatment before application of a coating material so that the air bubbles in the coating material are made fine using a shear force and the air bubbles are likely to escape from the surface before being dried. Here, the amount of air bubbles escaping during the drying can be adjusted by changing the treatment time (treatment length) and the rotation speed of the line mixing to adjust the size of air bubbles in the coating material.

The treatment time and the rotation speed of the line mixing may be appropriately set according to the desired pore volume, the kind of the matrix, the kind of the solvent (the above-described substance), the proportion of the solvent, the viscosity of the coating material, the thickness of the polymer-based piezoelectric composite material to be formed, and the like.

Next, an example of the method of producing the piezoelectric film 10 will be described with reference to FIGS. 3 to 5.

Figure 3:
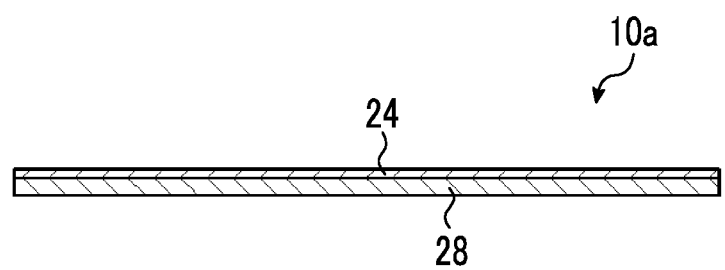
FIG. 3 is a conceptual view for describing an example of a method of preparing a piezoelectric film.
Figure 4:
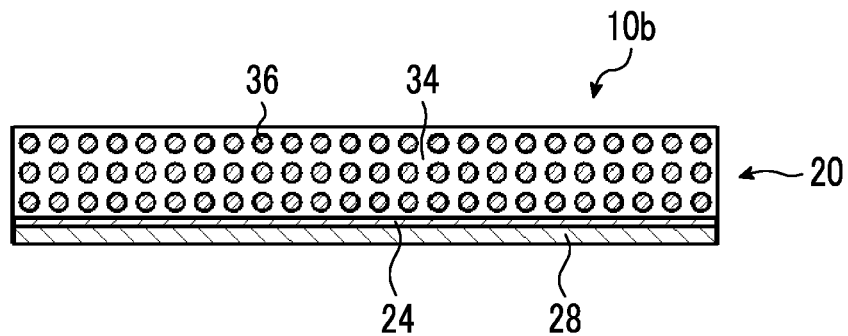
FIG. 4 is a conceptual view for describing an example of a method of preparing a piezoelectric film.

First, as illustrated in FIG. 3, a sheet-like material 10a in which the lower electrode 24 is formed on the lower protective layer 28 is prepared. The sheet-like material 10a may be prepared by forming a copper thin film or the like as the lower electrode 24 on the surface of the lower protective layer 28 by carrying out vacuum vapor deposition, sputtering, plating, or the like.

In a case where the lower protective layer 28 is extremely thin and thus the handleability is degraded, the lower protective layer 28 with a separator (temporary support) may be used as necessary. Further, a PET having a thickness of 25 µm to 100 µm or the like can be used as the separator. The separator may be removed after thermal compression bonding of the upper electrode 26 and the upper protective layer 30 and before lamination of any member on the lower protective layer 28.

Meanwhile, the coating material is prepared by dissolving a polymer material serving as a material of the matrix in an organic solvent, adding the piezoelectric particles 36 such as PZT particles thereto, and stirring the solution for dispersion.

The organic solvent other than the above-described substances is not limited, and various organic solvents can be used.

Here, as described above, the line mixing treatment is performed before application of the prepared coating material. By performing the line mixing treatment, the air bubbles in the coating material are made fine and likely to escape from the surface before being dried, and thus the pore area of the prepared polymer-based piezoelectric composite material can be decreased.

In a case where the sheet-like material 10a is prepared and the coating material is prepared, the coating material is cast (applied) onto the sheet-like material 10a, and the organic solvent is evaporated and dried. In this manner, as illustrated in FIG. 4, a laminate 10b in which the lower electrode 24 is provided on the lower protective layer 28 and the piezoelectric layer 20 is formed on the lower electrode 24 is prepared. Further, the lower electrode 24 indicates an electrode on the base material side in a case where the piezoelectric layer 20 is applied, and does not indicate the vertical positional relationship in the laminate.

A casting method of the coating material is not limited, and all known methods (coating devices) such as a slide coater or a doctor knife can be used.

As described above, in the piezoelectric film 10, in addition to the viscoelastic material such as cyanoethylated PVA, a dielectric polymer material may be added to the matrix 34.

In a case where the polymer material is added to the matrix 34, the polymer material added to the coating material may be dissolved.

In a case where the laminate 10b in which the lower electrode 24 is provided on the lower protective layer 28 and the piezoelectric layer 20 is formed on the lower electrode 24 is prepared, it is preferable that the piezoelectric layer 20 is subjected to a polarization treatment (poling).

A method of performing the polarization treatment on the piezoelectric layer 20 is not limited, and a known method can be used.

Before the polarization treatment, a calender treatment may be performed to smoothen the surface of the piezoelectric layer 20 using a heating roller or the like. By performing the calender treatment, a thermal compression bonding step described below can be smoothly performed.

In this manner, while the piezoelectric layer 20 of the laminate 10b is subjected to the polarization treatment, a sheet-like material 10c in which the upper electrode 26 is formed on the upper protective layer 30 is prepared. The sheet-like material 10c may be prepared by forming a copper thin film or the like as the upper electrode 26 on the surface of the upper protective layer 30 using vacuum vapor deposition, sputtering, plating, or the like.

Figure 5:
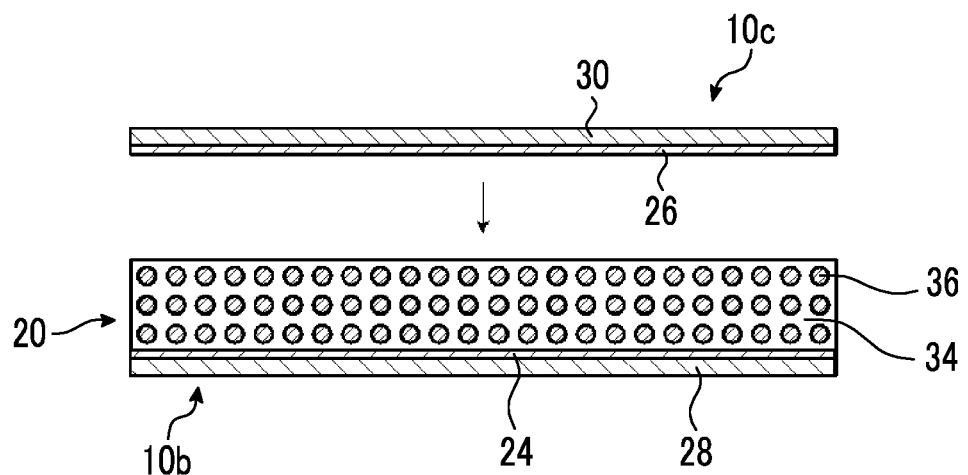
FIG. 5 is a conceptual view for describing an example of a method of preparing a piezoelectric film.

Next, as illustrated in FIG. 5, the sheet-like material 10c is laminated on the laminate 10b in which the polarization treatment performed on the piezoelectric layer 20 is completed in a state where the upper electrode 26 is directed toward the piezoelectric layer 20.

Further, a laminate of the laminate 10b and the sheet-like material 10c is subjected to the thermal compression bonding using a heating press device, a heating roller pair, or the like and cut to have a desired shape such that the laminate of the laminate 10b and the sheet-like material 10c is interposed between the upper protective layer 30 and the lower protective layer 28, thereby preparing the piezoelectric film 10.

The laminated piezoelectric element 14 described below has a configuration in which the piezoelectric films 10 according to the embodiment of the present invention are laminated and bonded to each other using a bonding layer 19 as a preferred embodiment. In the laminated piezoelectric element 14 illustrated in FIG. 7, as indicated by the arrows shown in the piezoelectric layer 20 as a preferred embodiment, the polarization directions of the piezoelectric films 10 adjacent to each other are opposite to each other.

A typical laminated ceramic piezoelectric element in which piezoelectric ceramic materials are laminated is subjected to a polarization treatment after preparation of a laminate of the piezoelectric ceramic materials. Only common electrodes exist at the interface between the piezoelectric layers, and thus the polarization directions of the piezoelectric layers alternate in the lamination direction.

On the contrary, the laminated piezoelectric element obtained by using the piezoelectric film 10 according to the embodiment of the present invention can be subjected to the polarization treatment in a state of the piezoelectric film 10 before lamination. It is preferable that the piezoelectric film 10 is subjected to the polarization treatment of the piezoelectric layer 20 before the lamination of the upper electrode 26 and the upper protective layer 30.

Therefore, the laminated piezoelectric element obtained by using the piezoelectric film according to the embodiment of the present invention can be prepared by laminating the piezoelectric films 10 after being subjected to the polarization treatment. It is preferable that a long piezoelectric film (a piezoelectric film with a large area) on which the polarization treatment has been performed is prepared and cut into individual piezoelectric films 10, and the piezoelectric films 10 are laminated to form the laminated piezoelectric element 14.

Figure 7:
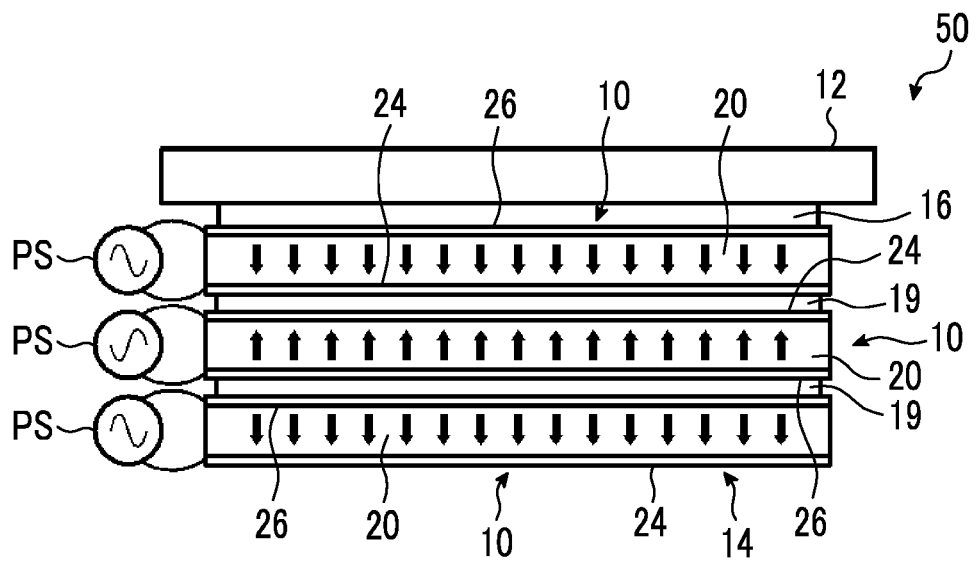
FIG. 7 is a conceptual view illustrating an example of an electroacoustic converter using a laminated piezoelectric element on which a piezoelectric film is laminated.
Figure 9:
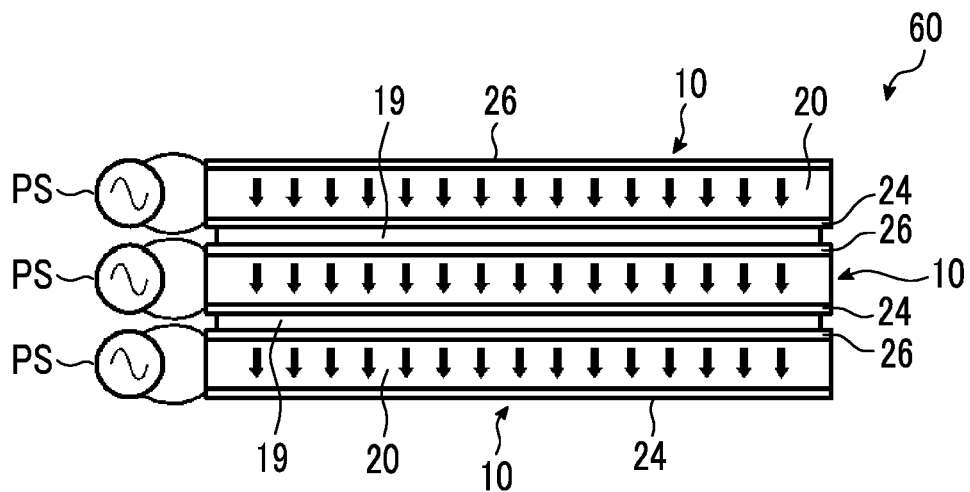
FIG. 9 is a conceptual view illustrating another example of a laminated piezoelectric element.

Therefore, in the laminated piezoelectric element obtained by using the piezoelectric film according to the embodiment of the present invention, the polarization directions of the piezoelectric films 10 adjacent to each other can be aligned in the lamination direction as in a laminated piezoelectric element 60 illustrated in FIG. 9, or can be alternated as in the laminated piezoelectric element 14 illustrated in FIG. 7.

Further, it is known that in a case where a typical piezoelectric film consisting of a polymer material such as PVDF is subjected to a stretching treatment in a uniaxial direction after the polarization treatment, the molecular chains are aligned with respect to the stretching direction, and as a result, excellent piezoelectric characteristics are obtained in the stretching direction. Therefore, a typical piezoelectric film has in-plane anisotropy as a piezoelectric characteristic and has anisotropy in the amount of stretch and contraction in the plane direction in a case where a voltage is applied.

On the contrary, the polymer-based piezoelectric composite material according to the embodiment of the present invention which is obtained by dispersing the piezoelectric particles 36 in the matrix 34 achieves excellent piezoelectric characteristics without performing the stretching treatment after the polarization treatment. Therefore, the polymer-based piezoelectric composite material according to the embodiment of the present invention has no in-plane anisotropy as a piezoelectric characteristic, and stretches and contracts isotropically in all directions in an in-plane direction in a case where a driving voltage is applied as described later.

The polymer-based piezoelectric composite material and the piezoelectric film 10 according to the embodiment of the present invention may be produced by using a cut sheet-like material, but preferably roll-to-roll (hereinafter, also referred to as RtoR) is used.

As is well known, RtoR is a production method of pulling out a long raw material from a roll around which the raw material is wound, performing various treatments such as film formation and a surface treatment while transporting the raw material in the longitudinal direction, and winding the treated raw material into a roll shape again.

In a case where the piezoelectric film 10 is produced by the above-described production method by RtoR, a first roll obtained by winding the sheet-like material 10a having the lower electrode 24 formed on the long lower protective layer 28, and a second roll obtained by winding the sheet-like material 10c having the upper electrode 26 formed on the long upper protective layer 30 are used.

The first roll and the second roll may be exactly the same.

The sheet-like material 10a is pulled out from the roll, coated with a coating material containing the matrix 34 and the piezoelectric particles 36 while being transported in the longitudinal direction, and dried by being heated or the like to form the piezoelectric layer 20 on the lower electrode 24, thereby obtaining the laminate 10b described above.

Next, the polarization treatment is performed on the piezoelectric layer 20 by performing the above-described polarization treatment. Here, in a case where the piezoelectric film 10 is produced by RtoR, the polarization treatment is performed on the piezoelectric layer 20 while the laminate 10b is transported. Before the polarization treatment, the calender treatment may be performed as described above.

Next, the sheet-like material 10c is laminated on the laminate 10b in a state where the upper electrode 26 is directed toward the piezoelectric layer 20 as described above according to a known method of pulling out the sheet-like material 10c from a second roll and utilizing a bonding roller or the like while transporting the sheet-like material 10c and the laminate.

Thereafter, the laminate 10b and the sheet-like material 10c which have been laminated are interposed and transported between a pair of heating rollers to be subjected to thermal compression bonding to complete the piezoelectric film 10 according to the embodiment of the present invention, and the piezoelectric film 10 is wound in a roll shape.

In the above-described example, the piezoelectric film 10 according to the embodiment of the present invention is prepared by transporting the sheet-like material (laminate) only once in the longitudinal direction by RtoR, but the present invention is not limited thereto.

For example, the above-described laminate 10b is formed, the polarization treatment is performed, and the laminate is wound once into a roll shape to obtain a laminate roll. Next, the laminate is pulled out from the laminate roll, the sheet-like material in which the upper electrode 26 is formed on the upper protective layer 30 is laminated as described above while the laminate is transported in the longitudinal direction, the piezoelectric film 10 is completed, and the piezoelectric film 10 may be wound into a roll shape.

In a case where a voltage is applied to the lower electrode 24 and the upper electrode 26 of the piezoelectric film 10, the piezoelectric particles 36 stretch and contract in the polarization direction according to the applied voltage. As a result, the piezoelectric film 10 (piezoelectric layer 20) contracts in the thickness direction. At the same time, the piezoelectric film 10 stretches and contracts in the in-plane direction due to the Poisson's ratio. The degree of stretch and contraction is approximately in a range of 0.01% to 0.1%. In the in-plane direction, the piezoelectric film 10 stretches and contracts isotropically in all directions as described above.

As described above, the thickness of the piezoelectric layer 20 is preferably approximately 10 to 300 μm. Therefore, the degree of stretch and contraction in the thickness direction is as extremely small as approximately 0.3 μm at the maximum.

On the contrary, the piezoelectric film 10, that is, the piezoelectric layer 20, has a size much larger than the thickness in the plane direction. Therefore, for example, in a case where the length of the piezoelectric film 10 is 20 cm, the piezoelectric film 10 stretches and contracts by a maximum of approximately 0.2 mm by the application of a voltage.

Further, in a case where a pressure is applied to the piezoelectric film 10, electric power is generated by the action of the piezoelectric particles 36.

By utilizing this, the piezoelectric film 10 can be used for various applications such as a speaker, a microphone, and a pressure sensitive sensor as described above.

[Piezoelectric Speaker]

Figure 6:
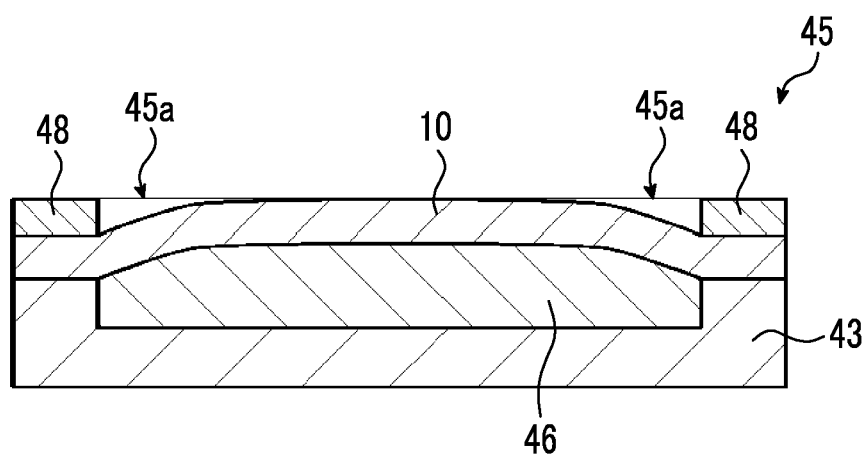
FIG. 6 is a conceptual view illustrating an example of a piezoelectric speaker using the piezoelectric film of FIG. 1.

FIG. 6 is a conceptual view illustrating an example of a flat plate type piezoelectric speaker including the piezoelectric film 10 according to the embodiment of the present invention.

The piezoelectric speaker 45 is a flat plate type piezoelectric speaker that uses the piezoelectric film 10 according to the embodiment of the present invention as a vibration plate that converts an electrical signal into vibration energy. Further, the piezoelectric speaker 45 can also be used as a microphone, a sensor, or the like.

The piezoelectric speaker 45 is configured to include the piezoelectric film 10, a case 43, a viscoelastic support 46, and a frame 48.

The case 43 is a thin regular square tubular housing formed of plastic or the like and having one surface that is open.

The frame 48 is a plate material having a through-hole at the center and having the same shape as the upper end surface (open surface side) of the case 43.

The viscoelastic support 46 is a support used for efficiently converting the stretch and contraction movement of the piezoelectric film 10 into a forward and rearward movement (a movement in the direction perpendicular to the surface of the film) by means of having moderate viscosity and elasticity, supporting the piezoelectric film 10, and applying a constant mechanical bias to any place of the piezoelectric film Examples of the viscoelastic support 46 include wool felt, nonwoven fabric such as wool felt containing rayon and PET, and glass wool.

The piezoelectric speaker 45 is configured by accommodating the viscoelastic support 46 in the case 43, covering the case 43 and the viscoelastic support 46 with the piezoelectric film 10, and fixing the frame 48 to the case 43 in a state of pressing the periphery of the piezoelectric film 10 against the upper end surface of the case 43 by the frame 48.

Here, in the piezoelectric speaker 45, the viscoelastic support 46 has a square columnar shape whose height (thickness) is larger than the height of the inner surface of the case 43.

Therefore, in the piezoelectric speaker 45, the viscoelastic support 46 is held in a state of being thinned by being pressed downward by the piezoelectric film 10 at the peripheral portion of the viscoelastic support 46. Similarly, in the peripheral portion of the viscoelastic support 46, the curvature of the piezoelectric film 10 suddenly fluctuates, and a rising portion 45a that decreases in height toward the periphery of the viscoelastic support 46 is formed in the piezoelectric film 10. Further, the central region of the piezoelectric film 10 is pressed by the viscoelastic support 46 having a square columnar shape and has a (approximately) planar shape.

In the piezoelectric speaker 45, in a case where the piezoelectric film 10 is stretched in the in-plane direction due to the application of a driving voltage to the lower electrode 24 and the upper electrode 26, the rising portion 45a of the piezoelectric film 10 changes the angle in a rising direction due to the action of the viscoelastic support 46 in order to absorb the stretched part. As a result, the piezoelectric film 10 having the planar portion moves upward.

On the contrary, in a case where the piezoelectric film 10 contracts in the in-plane direction due to the application of the driving voltage to the lower electrode 24 and the upper electrode 26, the rising portion 45a of the piezoelectric film 10 changes the angle in a falling direction (a direction approaching the flat surface) in order to absorb the contracted portion. As a result, the piezoelectric film 10 having the planar portion moves downward.

The piezoelectric speaker 45 generates a sound by the vibration of the piezoelectric film 10.

In the piezoelectric film 10 according to the embodiment of the present invention, the conversion from the stretching and contracting movement to vibration can also be achieved by holding the piezoelectric film 10 in a curved state.

Therefore, the piezoelectric film 10 according to the embodiment of the present invention can function as a speaker having flexibility by being simply held in a curved state instead of the piezoelectric speaker 45.

[Electroacoustic Converter]

FIG. 7 conceptually illustrates an example of an electroacoustic converter including the piezoelectric film 10 according to the embodiment of the present invention.

An electroacoustic converter 50 illustrated in FIG. 7 includes the laminated piezoelectric element 14 and the vibration plate 12. The laminated piezoelectric element 14 is formed by laminating a plurality of layers of the piezoelectric films according to the embodiment of the present invention. The laminated piezoelectric element 14 in the example illustrated in FIG. 7 is obtained by laminating three layers of the above-described piezoelectric films 10 according to the embodiment of the present invention.

In the electroacoustic converter 50, the laminated piezoelectric element 14 and the vibration plate 12 are bonded to each other by a bonding layer 16.

Power sources PS for applying a driving voltage are connected to the piezoelectric films 10 constituting the laminated piezoelectric element 14 of the electroacoustic converter 50.

For simplification of the drawings, the lower protective layer 28 and the upper protective layer 30 are omitted in FIG. 7. However, in the laminated piezoelectric element 14 illustrated in FIG. 7, as a preferred embodiment, all the piezoelectric films 10 have both the lower protective layer 28 and the upper protective layer 30.

However, the laminated piezoelectric element is not limited thereto, and a piezoelectric film having a protective layer and a piezoelectric film having no protective layer may be mixed. Further, in a case where the piezoelectric film has a protective layer, the piezoelectric film may have only the lower protective layer 28 or only the upper protective layer 30. As an example, the laminated piezoelectric element 14 having a three-layer configuration as illustrated in FIG. 7 may have a configuration in which the piezoelectric film which is the uppermost layer in the figure has only the upper protective layer 30, the piezoelectric film which is the middle layer has no protective layer, and the piezoelectric film which is the lowermost layer has only the lower protective layer 28.

From this viewpoint, the same applies to the laminated piezoelectric element 56 illustrated in FIG. 8 and the laminated piezoelectric element 60 illustrated in FIG. 9, which will be described later.

As will be described in detail later, in the electroacoustic converter 50, in a case where the driving voltage is applied to the piezoelectric film 10 of the laminated piezoelectric element 14, the piezoelectric film 10 stretches and contracts in the plane direction, and the laminated piezoelectric element 14 stretches and contracts in the plane direction due to the stretching and contracting of the piezoelectric film 10.

The stretching and contracting of the laminated piezoelectric element 14 in the plane direction causes the vibration plate 12 to bend, and as a result, the vibration plate 12 vibrates in the thickness direction. The vibration plate 12 generates a sound due to the vibration in the thickness direction. That is, the vibration plate 12 vibrates according to the magnitude of the driving voltage applied to the piezoelectric film 10, and generates a sound according to the driving voltage applied to the piezoelectric film 10.

That is, the electroacoustic converter 50 is a speaker that uses the laminated piezoelectric element 14 as an exciter.

In the electroacoustic converter 50, the vibration plate 12 has flexibility as a preferred embodiment. In the present invention, the expression of "having flexibility" is synonymous with having flexibility in the general interpretation, and indicates being capable of bending and being flexible, specifically, being capable of bending and stretching without causing breakage and damage.

The vibration plate 12 is not limited as long as the vibration plate 12 preferably has flexibility and satisfies the relationship with the laminated piezoelectric element 14 described later, and various sheet-like materials (plate-like materials or films) can be used.

Examples of the vibration plate 12 include resin films consisting of polyethylene terephthalate (PET), polypropylene (PP), polystyrene (PS), polycarbonate (PC), polyphenylene sulfide (PPS), polymethylmethacrylate (PMMA), and polyetherimide (PEI), polyimide (PI), polyethylene naphthalate (PEN), triacetyl cellulose (TAC), a cyclic olefin-based resin, or the like, foamed plastic consisting of foamed polystyrene, foamed styrene, foamed polyethylene, or the like, and various kinds of corrugated cardboard materials obtained by bonding other paperboards to one or both surfaces of wavy paperboards.

Further, in the electroacoustic converter 50, a display device such as an organic electroluminescence (organic light emitting diode (OLED)) display, a liquid crystal display, a micro light emitting diode (LED) display, or an inorganic electroluminescence display can be suitably used as the vibration plate 12 as long as these have flexibility.

In the electroacoustic converter 50 illustrated in FIG. 7, as a preferred embodiment, the vibration plate 12 and the laminated piezoelectric element 14 are bonded to each other with the bonding layer 16.

Various known layers can be used as the bonding layer 16 as long as the vibration plate 12 and the laminated piezoelectric element 14 can be bonded to each other.

Therefore, the bonding layer 16 may be a layer consisting of an adhesive, which has fluidity during bonding and thereafter enters a solid state, a layer consisting of a pressure sensitive adhesive, which is a gel-like (rubber-like) flexible solid during bonding and does not change in the gel-like state thereafter, or a layer consisting of a material having characteristics of both an adhesive and a pressure sensitive adhesive.

Here, in the electroacoustic converter 50, the laminated piezoelectric element 14 is stretched and contracted to bend and vibrate the vibration plate 12 to generate a sound. Therefore, in the electroacoustic converter 50, it is preferable that the stretching and contracting of the laminated piezoelectric element 14 is directly transmitted to the vibration plate 12. In a case where a substance having a viscosity that relieves vibration is present between the vibration plate 12 and the laminated piezoelectric element 14, the efficiency of transmitting the stretching and contracting energy of the laminated piezoelectric element 14 to the vibration plate 12 is lowered, and the driving efficiency of the electroacoustic converter 50 is also decreased.

In consideration of this point, it is preferable that the bonding layer 16 is an adhesive layer consisting of an adhesive from which a solid and hard bonding layer 16 is obtained, rather than a pressure sensitive adhesive layer consisting of a pressure sensitive adhesive. As a more preferable bonding layer 16, specifically, a bonding layer consisting of a thermoplastic type adhesive such as a polyester-based adhesive or a styrene-butadiene rubber (SBR)-based adhesive is exemplified.

Adhesion, which is different from pressure sensitive adhesion, is useful in a case where a high adhesion temperature is required. Further, the thermoplastic type adhesive has characteristics of "a relatively low temperature, a short time, and strong adhesion", which is suitable.

The thickness of the bonding layer 16 is not limited, and a thickness at which sufficient bonding force (adhesive force or pressure sensitive adhesive force) can be obtained may be appropriately set according to the material of the bonding layer 16.

Here, in the electroacoustic converter 50, it is preferable that the thickness of the bonding layer 16 decreases because the effect of transmitting the stretching and contracting energy (vibration energy) of the laminated piezoelectric element 14 transmitted to the vibration plate 12 increases and the energy efficiency increases. In addition, in a case where the bonding layer 16 is thick and has high rigidity, there is also a possibility that the stretching and contracting of the laminated piezoelectric element 14 may be constrained.

In consideration of this point, it is preferable that the bonding layer 16 is thin. Specifically, the thickness of the bonding layer 16 is preferably in a range of 0.1 to 50 µm, more preferably in a range of 0.1 to 30 µm, and still more preferably in a range of 0.1 to 10 µm in terms of thickness after bonding.

In the electroacoustic converter 50, the bonding layer 16 is provided as a preferred embodiment and is not an essential constituent element.

Therefore, the electroacoustic converter 50 may fix the vibration plate 12 and the laminated piezoelectric element 14 using a known pressure bonding unit, a fastening unit, a fixing unit, or the like without having the bonding layer 16. For example, in a case where the laminated piezoelectric element 14 is rectangular, the electroacoustic converter may be configured by fastening four corners with members such as bolts and nuts, or the electroacoustic converter may be configured by fastening the four corners and a center portion with members such as bolts and nuts.

However, in this case, in a case where the driving voltage is applied from the power source PS, the laminated piezoelectric element 14 stretches and contracts independently of the vibration plate 12, and in some cases, only the laminated piezoelectric element 14 bends, and the stretching and contracting of the laminated piezoelectric element 14 is not transmitted to the vibration plate 12. As described above, in a case where the laminated piezoelectric element 14 stretches and contracts independently of the vibration plate 12, the vibration efficiency of the vibration plate 12 due to the laminated piezoelectric element 14 degraded.

Thus, the vibration plate 12 may not be sufficiently vibrated.

In consideration of this point, it is preferable that the vibration plate and the laminated piezoelectric element 14 are bonded to each other with the bonding layer 16 as illustrated in FIG. 7.

In the electroacoustic converter 50 illustrated in FIG. 7, the laminated piezoelectric element 14 has a configuration in which three piezoelectric films 10 are laminated and the adjacent piezoelectric films 10 are bonded to each other with the bonding layer 19. The power sources PS that apply a driving voltage for stretching and contracting the piezoelectric films 10 are respectively connected to the piezoelectric films 10.

Further the laminated piezoelectric element 14 illustrated in FIG. 7 is formed by laminating three piezoelectric films 10, but the present invention is not limited thereto. That is, the number of laminated piezoelectric films 10 may be two or four or more in a case where the laminated piezoelectric element is formed by laminating a plurality of layers of the piezoelectric films 10. From this viewpoint, the same applies to the laminated piezoelectric element 56 illustrated in FIG. 8 and the laminated piezoelectric element 60 illustrated in FIG. 9, which will be described later.

In addition, the electroacoustic converter may generate a sound by vibrating the vibration plate 12 with the same action and effect using the piezoelectric film according to the embodiment of the present invention instead of the laminated piezoelectric element 14. That is, the electroacoustic converter may use the piezoelectric film according to the embodiment of the present invention as an exciter.

As a preferred embodiment, the laminated piezoelectric element 14 illustrated in FIG. 7 has a configuration in which a plurality of layers (three layers in the example illustrated in FIG. 7) of the piezoelectric films 10 are laminated in a state where the polarization directions of the piezoelectric films 10 adjacent to each other are opposite to each other, and the adjacent piezoelectric films 10 are bonded to each other with the bonding layer 19.

As the bonding layer 19, various known layers can be used as long as the adjacent piezoelectric films 10 can be bonded to each other.

Therefore, the bonding layer 19 may be a layer consisting of an adhesive, a layer consisting of a pressure sensitive adhesive, or a layer consisting of a material having characteristics of both an adhesive and a pressure sensitive adhesive, which are described above.

Here, the laminated piezoelectric element 14 vibrates the vibration plate 12 and generates a sound by stretching and contracting the plurality of laminated piezoelectric films 10. Therefore, in the laminated piezoelectric element 14, it is preferable that the stretching and contracting of each piezoelectric film 10 is directly transmitted. In a case where a substance having a viscosity that relieves vibration is present between the piezoelectric films 10, the efficiency of transmitting the stretching and contracting energy of the piezoelectric film 10 is lowered, and the driving efficiency of the laminated piezoelectric element 14 is also degraded.

In consideration of this point, it is preferable that the bonding layer 19 is an adhesive layer consisting of an adhesive from which a solid and hard bonding layer 19 is obtained, rather than a pressure sensitive adhesive layer consisting of a pressure sensitive adhesive. As a more preferable bonding layer 19, specifically, a bonding layer consisting of a thermoplastic type adhesive such as a polyester-based adhesive or a styrene-butadiene rubber (SBR)-based adhesive is suitably exemplified.

Adhesion, which is different from pressure sensitive adhesion, is useful in a case where a high adhesion temperature is required. Further, the thermoplastic type adhesive has characteristics of "a relatively low temperature, a short time, and strong adhesion", which is suitable.

The thickness of the bonding layer 19 is not limited, and a thickness that enables a sufficient bonding force to be exhibited may be appropriately set according to the material for forming the bonding layer 19.

Here, in the laminated piezoelectric element 14 illustrated in FIG. 7, it is preferable that the thickness of the bonding layer 19 decreases because the effect of transmitting the stretching and contracting energy of the piezoelectric film 10 increases, and the energy efficiency increases. In addition, in a case where the bonding layer 19 is thick and has high rigidity, there is also a possibility that the stretching and contracting of the piezoelectric film 10 may be constrained.

In consideration of this point, it is preferable that the bonding layer 19 is thinner than the piezoelectric layer 20. That is, it is preferable that the bonding layer 19 in the laminated piezoelectric element 14 is hard and thin. Specifically, the thickness of the bonding layer 19 is preferably in a range of 0.1 to 50 µm, more preferably in a range of 0.1 to 30 µm, and still more preferably in a range of 0.1 to 10 µm in terms of thickness after the bonding.

Further, as will be described later, in the laminated piezoelectric element 14 illustrated in FIG. 7, since the polarization directions of the adjacent piezoelectric films are opposite to each other and there is no concern that the adjacent piezoelectric films 10 may be short-circuited, the bonding layer 19 can be made thin.

In the laminated piezoelectric element 14 illustrated in FIG. 7, in a case where the spring constant (thickness× Young's modulus) of the bonding layer 19 is high, there is a possibility that the stretching and contracting of the piezoelectric film 10 may be constrained. Therefore, it is preferable that the spring constant of the bonding layer 19 is less than or equal to the spring constant of the piezoelectric film 10.

Specifically, the product of the thickness of the bonding layer 19 and the storage elastic modulus (E') at a frequency of 1 Hz according to the dynamic viscoelasticity measurement is preferably $2.0 \times 10^6$ N/m or less at 0° C. and $1.0 \times 10^6$ N/m or less at 50° C.

It is preferable that the internal loss of the bonding layer at a frequency of 1 Hz according to the dynamic viscoelasticity measurement is 1.0 or less at 25° C. in the case of the bonding layer 19 consisting of a pressure sensitive adhesive, and is 0.1 or less at 25° C. in the case of the bonding layer 19 consisting of an adhesive.

In the laminated piezoelectric element 14 constituting the electroacoustic converter 50, the bonding layer 19 is provided as a preferred embodiment and is not an essential constituent element.

Therefore, in the laminated piezoelectric element constituting the electroacoustic converter, the laminated piezoelectric element may be configured by laminating the piezoelectric films 10 so that the piezoelectric films are in close contact with each other using a known pressure bonding unit, a fastening unit, a fixing unit, or the like without having the bonding layer 19. For example, in a case where the piezoelectric film 10 is rectangular, the laminated piezoelectric element may be configured by fastening four corners with bolts, nuts, and the like or the laminated piezoelectric element may be configured by fastening four corners and a center portion with bolts, nuts, and the like. Alternatively, the laminated piezoelectric element may be configured by laminating the piezoelectric films 10 and thereafter bonding the peripheral portion (end surface) with a pressure sensitive adhesive tape to fix the laminated piezoelectric films 10.

However, in this case, in a case where a driving voltage is applied from the power source PS, the individual piezoelectric films 10 stretch and contract independently, and in some cases, layers of the piezoelectric films 10 bend in opposite directions and form a void. As described above, in a case where the individual piezoelectric films 10 stretch and contract independently, the driving efficiency of the laminated piezoelectric element decreases, the degree of stretching and contracting of the entire laminated piezoelectric element decreases, and there is a possibility that an abutting vibration plate or the like cannot be sufficiently vibrated. In particular, in a case where the layers of the piezoelectric films 10 bend in the opposite directions and form a void, the driving efficiency of the laminated piezoelectric element is greatly decreased.

In consideration of this point, it is preferable that the laminated piezoelectric element has the bonding layer 19 for bonding adjacent piezoelectric films 10 to each other, as in the laminated piezoelectric element 14 illustrated in FIG. 7.

As illustrated in FIG. 7, in the electroacoustic converter 50, the power source PS that applies the driving voltage for stretching and contracting the piezoelectric film 10, that is, supplies driving power, is connected to the lower electrode 24 and the upper electrode 26 of each of the piezoelectric films 10.

The power source PS is not limited and may be a direct-current power source or an alternating-current power source. In addition, as for the driving voltage, a driving voltage capable of appropriately driving each of the piezoelectric films 10 may be appropriately set according to the thickness, the forming material, and the like of the piezoelectric layer 20 of each piezoelectric film 10.

As will be described later, in the laminated piezoelectric element 14, the polarization directions of the adjacent piezoelectric films 10 are opposite to each other. Therefore, in the adjacent piezoelectric films 10, the lower electrodes 24 face each other and the upper electrodes 26 face each other. Therefore, the power source PS constantly supplies power of the same polarity to the facing electrodes regardless of whether the power source PS is an alternating-current power source or a direct-current power source. For example, in the laminated piezoelectric element 14 illustrated in FIG. 7, power of the same polarity is constantly supplied to the upper electrode 26 of the piezoelectric film 10 which is the lowermost layer in the figure and the upper electrode 26 of the piezoelectric film 10 which is the second layer (middle layer), and power of the same polarity is constantly supplied to the lower electrode 24 of the piezoelectric film 10 which is the second layer and the lower electrode 24 of the piezoelectric film 10 which is the uppermost layer in the figure.

A method of leading out an electrode from the lower electrode 24 and the upper electrode 26 is not limited, and various known methods can be used.

As an example, a method of leading out an electrode to the outside by connecting a conductor such as a copper foil to the lower electrode 24 and the upper electrode 26, and a method of leading out an electrode to the outside by forming through-holes in the lower protective layer 28 and the upper protective layer 30 by a laser or the like and filling the through-holes with a conductive material are exemplified.

As a suitable method of leading out an electrode, the method described in JP2014-209724A, the method described in JP2016-015354A, and the like are exemplified.

As described above, the piezoelectric layer 20 is formed by dispersing the piezoelectric particles 36 in the matrix 34. In addition, the lower electrode 24 and the upper electrode 26 are provided to interpose the piezoelectric layer 20 therebetween in the thickness direction.

In a case where a voltage is applied to the lower electrode 24 and the upper electrode 26 of the piezoelectric film 10 having the piezoelectric layer 20, the piezoelectric particles 36 stretch and contract in the polarization direction according to the applied voltage. As a result, the piezoelectric film 10 (piezoelectric layer 20) contracts in the thickness direction. At the same time, the piezoelectric film 10 stretches and contracts in the in-plane direction due to the Poisson's ratio.

The degree of stretch and contraction is approximately in a range of 0.01% to 0.1%. As described above, the thickness of the piezoelectric layer 20 is preferably approximately 10 to 300 μm. Therefore, the degree of stretch and contraction in the thickness direction is as extremely small as approximately 0.3 μm at the maximum.

On the contrary, the piezoelectric film 10, that is, the piezoelectric layer 20, has a size much larger than the thickness in the plane direction. Therefore, for example, in a case where the length of the piezoelectric film 10 is 20 cm, the piezoelectric film 10 stretches and contracts by a maximum of approximately 0.2 mm by the application of a voltage.

The laminated piezoelectric element 14 is formed by laminating and bonding the piezoelectric films 10. Therefore, in a case where the piezoelectric film 10 stretches and contracts, the laminated piezoelectric element 14 also stretches and contracts.

The vibration plate 12 is bonded to the laminated piezoelectric element 14 by the bonding layer 16. Therefore, the stretching and contracting of the laminated piezoelectric element 14 causes the vibration plate 12 to bend, and as a result, the vibration plate 12 vibrates in the thickness direction.

The vibration plate 12 generates a sound due to the vibration in the thickness direction. That is, the vibration plate 12 vibrates according to the magnitude of the voltage (driving voltage) applied to the piezoelectric film 10, and generates a sound according to the driving voltage applied to the piezoelectric film 10.

As described above, a typical piezoelectric film consisting of a polymer material such as PVDF has in-plane anisotropy as a piezoelectric characteristic, and has anisotropy in the amount of stretching and contracting in the plane direction in a case where a voltage is applied.

On the contrary, in the electroacoustic converter 50 illustrated in FIG. 7, the piezoelectric film 10 according to the embodiment of the present invention which constitute the laminated piezoelectric element 14 has no in-plane anisotropy as a piezoelectric characteristic and stretches and contracts isotropically in all directions in the in-plane direction. That is, in the electroacoustic converter 50 illustrated in FIG. 7, the piezoelectric film 10 constituting the laminated piezoelectric element 14 stretches and contracts isotropically and two-dimensionally.

According to the laminated piezoelectric element 14 in which such piezoelectric films 10 that stretch and contract isotropically and two-dimensionally are laminated, compared to a case where typical piezoelectric films formed of PVDF or the like that stretch and contract greatly in only one direction are laminated, the vibration plate 12 can be vibrated with a large force, and a louder and more beautiful sound can be generated.

The laminated piezoelectric element 14 illustrated in FIG. 7 is obtained by laminating a plurality of the piezoelectric films 10. The laminated piezoelectric element 14 is formed by further bonding the piezoelectric films 10 adjacent to each other with the bonding layer 19 as a preferred embodiment.

Therefore, even in a case where the rigidity of each piezoelectric film 10 is low and the stretching and contracting force thereof is small, the rigidity is increased by laminating the piezoelectric films 10, and the stretching and contracting force as the laminated piezoelectric element 14 is increased. As a result, in the laminated piezoelectric element 14, even in a case where the vibration plate 12 has a certain degree of rigidity, the vibration plate 12 is sufficiently bent with a large force and the vibration plate 12 can be sufficiently vibrated in the thickness direction, whereby the vibration plate 12 can generate a sound.

Further, in a case where the thickness of the piezoelectric layer 20 increases, the stretching and contracting force of the piezoelectric film 10 increases, but the driving voltage required for stretching and contracting the film is increased by the same amount. Here, as described above, in the laminated piezoelectric element 14, since the maximum thickness of the piezoelectric layer 20 is preferably approximately 300 μm, the piezoelectric film 10 can be sufficiently stretched and contracted even in a case where the voltage applied to each piezoelectric film 10 is small.

It is preferable that the product of the thickness of the laminated piezoelectric element 14 and the storage elastic modulus at a frequency of 1 Hz and 25° C. according to the dynamic viscoelasticity measurement is 0.1 to 3 times the product of the thickness of the vibration plate 12 and the Young's modulus thereof.

As described above, the piezoelectric film 10 according to the embodiment of the present invention has satisfactory flexibility, and the laminated piezoelectric element 14 on which the piezoelectric film 10 is laminated also has satisfactory flexibility.

Further, the vibration plate 12 has a certain degree of rigidity. In a case where the laminated piezoelectric element 14 having rigidity is combined with the vibration plate 12, the combination is hard and unlikely to be bent, which is disadvantageous in terms of flexibility of the electroacoustic converter 50.

Meanwhile, in the electroacoustic converter 50, the product of the thickness of the laminated piezoelectric element 14 and the storage elastic modulus at a frequency of 1 Hz and 25° C. according to the dynamic viscoelasticity measurement is preferably three times or less the product of the thickness of the vibration plate 12 and the Young's modulus thereof. That is, in the laminated piezoelectric element 14, the spring constant with respect to a slow movement is preferably three times or less that of the vibration plate 12.

With this configuration, the electroacoustic converter 50 exhibits a behavior of being flexible with respect to a slow movement due to an external force such as bending and rolling, that is, exhibits satisfactory flexibility with respect to a slow movement.

In the electroacoustic converter 50, the product of the thickness of the laminated piezoelectric element 14 and the storage elastic modulus at a frequency of 1 Hz and 25° C. according to the dynamic viscoelasticity measurement is more preferably two times or less, still more preferably one time or less, and particularly preferably 0.3 times or less the product of the thickness of the vibration plate 12 and the Young's modulus thereof.

In consideration of the material used for the laminated piezoelectric element 14, a preferable configuration of the laminated piezoelectric element 14, and the like, the product of the thickness of the laminated piezoelectric element 14 and the storage elastic modulus at a frequency of 1 Hz and 25° C. according to the dynamic viscoelasticity measurement is preferably 0.1 times or greater the product of the thickness of the vibration plate 12 and the Young's modulus thereof.

In the electroacoustic converter 50, the product of the thickness of the laminated piezoelectric element 14 and the storage elastic modulus at a frequency of 1 kHz and 25° C. in the master curve obtained from the dynamic viscoelasticity measurement is preferably in a range of 0.3 to 10 times the product of the thickness of the vibration plate 12 and the Young's modulus thereof. That is, in the laminated piezoelectric element 14, the spring constant for a fast movement in a driven state is preferably in a range of 0.3 to 10 times that of the vibration plate 12.

As described above, the electroacoustic converter 50 generates a sound by stretching and contracting the laminated piezoelectric element 14 in the plane direction to vibrate the vibration plate 12. Therefore, it is preferable that the laminated piezoelectric element 14 has a certain degree of rigidity (hardness, stiffness) with respect to the vibration plate 12 at a frequency of the audio band (20 Hz to 20 kHz).

In the electroacoustic converter 50, the product of the thickness of the laminated piezoelectric element 14 and the storage elastic modulus at a frequency of 1 kHz and 25° C. in the master curve obtained from the dynamic viscoelasticity measurement is set to preferably 0.3 times or greater, more preferably 0.5 times or greater, and still more preferably 1 time or greater the product of the thickness of the vibration plate 12 and the Young's modulus thereof. That is, in the laminated piezoelectric element 14, the spring constant with respect to a fast movement is preferably 0.3 times or greater, more preferably 0.5 times or greater, and still more preferably 1 time or greater that of the vibration plate 12.

In this manner, at a frequency of the audio band, the rigidity of the laminated piezoelectric element 14 with respect to the vibration plate 12 is sufficiently ensured, and the electroacoustic converter 50 can output a sound with a high sound pressure and high energy efficiency.

Meanwhile, in consideration of the materials available for the laminated piezoelectric element 14, a preferable configuration of the laminated piezoelectric element 14, and the like, the product of the thickness of the laminated piezoelectric element 14 and the storage elastic modulus at a frequency of 1 kHz and 25° C. according to the dynamic viscoelasticity measurement is preferably 10 times or less the product of the thickness of the vibration plate 12 and the Young's modulus thereof.

In regard to the product of the thickness and the storage elastic modulus described above, the same applies to a case where the electroacoustic converter is configured by using the piezoelectric film 10 instead of the laminated piezoelectric element 14.

In the electroacoustic converter 50 illustrated in FIG. 7, as a preferred embodiment, the polarization directions of the piezoelectric layers 20 of the adjacent piezoelectric films 10 in the laminated piezoelectric element 14 are opposite to each other as described above.

In the piezoelectric film 10, the polarity of the voltage applied to the piezoelectric layer 20 depends on the polarization direction. Therefore, in regard to the polarity of the voltage to be applied, the polarity of the electrode on the side in a direction in which the arrows are directed (the downstream side of the arrows) and the polarity of the electrode on the opposite side (the upstream side of the arrows) are coincident with each other in all the piezoelectric films 10 in the polarization directions indicated by the arrows in FIG. 7.

In the example illustrated in FIG. 7, the electrode on the side in the direction in which the arrows indicating the polarization direction are directed is defined as the lower electrode 24, the electrode on the opposite side is defined as the upper electrode 26, and the polarities of the upper electrode 26 and the lower electrode 24 are the same in all the piezoelectric films 10.

Therefore, in the laminated piezoelectric element 14 in which the polarization directions of the piezoelectric layers 20 of the adjacent piezoelectric films 10 are opposite to each other, the upper electrodes 26 face each other on one surface and the lower electrodes face each other on the other surface in the adjacent piezoelectric films 10. Therefore, in the laminated piezoelectric element 14, even in a case where the electrodes of the adjacent piezoelectric films 10 come into contact with each other, there is no risk of a short circuit.

As described above, in order to stretch and contract the laminated piezoelectric element 14 with satisfactory energy efficiency, it is preferable that the thickness of the bonding layer 19 is decreased so that the bonding layer 19 does not interfere with the stretching and contracting of the piezoelectric layer 20.

On the contrary, in the laminated piezoelectric element 14 illustrated in FIG. 7 in which there is no risk of a short circuit even in a case where the electrodes of the adjacent piezoelectric films 10 come into contact with each other, the bonding layer 19 may be omitted. In addition, even in a case where the bonding layer 19 is provided as a preferred embodiment, the bonding layer 19 can be made extremely thin as long as a required bonding force can be obtained.

Therefore, the laminated piezoelectric element 14 can be stretched and contracted with high energy efficiency.

As described above, in the piezoelectric film 10, the absolute amount of stretching and contracting of the piezoelectric layer 20 in the thickness direction is extremely small, and the stretching and contracting of the piezoelectric film 10 are made substantially only in the plane direction.

Therefore, even in a case where the polarization directions of the piezoelectric films 10 to be laminated are opposite to each other, all the piezoelectric films 10 stretch and contract in the same direction as long as the polarities of the voltages applied to the lower electrode 24 and the upper electrode 26 are correct.

In the laminated piezoelectric element 14, the polarization direction of the piezoelectric film 10 may be detected by a d33 meter or the like.

Alternatively, the polarization direction of the piezoelectric film 10 may be known from the treatment conditions of the polarization treatment described above.

In the laminated piezoelectric element 14 illustrated in FIG. 7, it is preferable that a long (large-area) piezoelectric film is prepared, and the long piezoelectric film is cut into individual piezoelectric films 10 as described above. Therefore, in this case, the plurality of piezoelectric films 10 constituting the laminated piezoelectric element 14 are all the same.

However, the present invention is not limited thereto. That is, the piezoelectric laminate in the electroacoustic converter may have any of various configurations such as a configuration in which piezoelectric films having different layer configurations, such as a piezoelectric film having the lower protective layer 28 and the upper protective layer 30 and a piezoelectric film having no lower protective layer and no upper protective layer, are laminated, a configuration in which piezoelectric films in which the thicknesses of the piezoelectric layers 20 are different from each other are laminated, and the like.

In the electroacoustic converter 50 illustrated in FIG. 7, the laminated piezoelectric element 14 is formed by laminating a plurality of piezoelectric films 10 in a state where the polarization directions of the piezoelectric films adjacent to each other are opposite to each other and bonding the adjacent piezoelectric films 10 with the bonding layer 19, as a preferred embodiment.

The laminated piezoelectric element according to the embodiment of the present invention is not limited thereto, and various configurations can be used.

Figure 8:
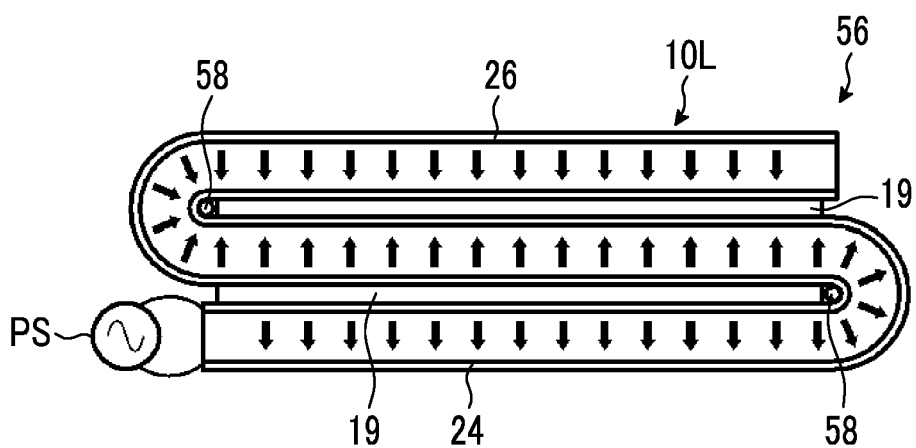
FIG. 8 is a conceptual view illustrating another example of a laminated piezoelectric element.

FIG. 8 illustrates an example thereof. Since the laminated piezoelectric element 56 illustrated in FIG. 8 uses a plurality of the same members as those of the laminated piezoelectric element 14 described above, the same members are denoted by the same reference numerals, and the description will be given mainly to different parts.

The laminated piezoelectric element 56 illustrated in FIG. 8 is a more preferred embodiment of the laminated piezoelectric element of the present invention, a long piezoelectric film 10L is folded back, for example, once or more, or preferably a plurality of times in the longitudinal direction so that a plurality of layers of the piezoelectric film 10L are laminated. In addition, similarly to the laminated piezoelectric element 14 illustrated in FIG. 7 and the like described above, in the laminated piezoelectric element 56 illustrated in FIG. 8, as a preferred embodiment, the piezoelectric film 10L laminated by folding-back is bonded with the bonding layer 19.

By folding back and laminating one sheet of the long piezoelectric film 10L polarized in the thickness direction, the polarization directions of the piezoelectric film 10L adjacent (facing) in the lamination direction are opposite directions as indicated by the arrows in FIG. 8.

According to this configuration, the laminated piezoelectric element 56 can be configured with only one long piezoelectric film 10L, only one power source PS for applying the driving voltage is required, and an electrode may be led out from the piezoelectric film 10L at one place.

Therefore, according to the laminated piezoelectric element 56 illustrated in FIG. 8, the number of components can be reduced, the configuration can be simplified, the reliability of the piezoelectric element (module) can be improved, and a further reduction in cost can be achieved.

Similar to the laminated piezoelectric element 56 illustrated in FIG. 8, in the laminated piezoelectric element 56 in which the long piezoelectric film 10L is folded back, it is preferable that a core rod 58 is brought into contact with the piezoelectric film 10L and inserted into the folded-back portion of the piezoelectric film 10L.

As described above, the lower electrode 24 and the upper electrode 26 of the piezoelectric film 10L are formed of a metal vapor deposition film or the like. In a case where the metal vapor deposition film is bent at an acute angle, cracks and the like are likely to occur, and thus the electrode may be broken. That is, in the laminated piezoelectric element 56 illustrated in FIG. 8, cracks and the like are likely to occur in the electrodes inside the bent portion.

For this, in the laminated piezoelectric element 56 in which the long piezoelectric film 10L is folded back, by inserting the core rod 58 into the folded-back portion of the piezoelectric film 10L, the lower electrode 24 and the upper electrode 26 are prevented from being bent. Therefore, the occurrence of breakage can be suitably prevented.

In the electroacoustic converter according to the embodiment of the present invention, the laminated piezoelectric element may use the bonding layer 19 having conductivity. In particular, in the laminated piezoelectric element 56 in which one sheet of the long piezoelectric film 10L is folded back and laminated as illustrated in FIG. 8, the bonding layer 19 having conductivity is preferably used.

In the laminated piezoelectric element in which the polarization directions of the adjacent piezoelectric film 10 are opposite to each other as illustrated in FIGS. 7 and 8, in the laminated piezoelectric film 10, electric power having the same polarity is supplied to the facing electrodes. Therefore, a short circuit does not occur between the facing electrodes.

On the other hand, as described above, in the laminated piezoelectric element 56 in which the piezoelectric film 10L is folded back and laminated, the electrode is likely to be broken inside the bent portion that is folded back at an acute angle.

Therefore, by bonding the laminated piezoelectric film 10L by the bonding layer 19 having conductivity, even in a case where the electrode is broken inside the bent portion, electrical conduction can be secured by the bonding layer 19, which prevents breakage and significantly improves the reliability of the laminated piezoelectric element 56.

Here, the piezoelectric film 10L forming the laminated piezoelectric element 56 preferably has the lower protective layer 28 and the upper protective layer 30 so that the lower electrode 24 and the upper electrode 26 face each other to interpose the laminate therebetween as illustrated in FIG. 1.

In this case, even in a case where the bonding layer 19 having conductivity is used, the conductivity cannot be secured. Therefore, in a case where the piezoelectric film 10L has a protective layer, through-holes may be provided in the lower protective layer 28 and the upper protective layer 30 in regions where the lower electrodes 24 face each other and the upper electrodes 26 face each other in the laminated piezoelectric film 10L, and the bonding layer 19 having conductivity may be brought into contact with the lower electrode 24 and the upper electrode 26. Preferably, the through-holes formed in the lower protective layer 28 and the upper protective layer 30 are closed with a silver paste or a conductive bonding agent, and the adjacent piezoelectric film 10L is bonded thereto with the bonding layer 19 having conductivity.

In this case, the through-holes of the lower protective layer 28 and the upper protective layer 30 may be formed by removal of the protective layers through laser processing, solvent etching, mechanical polishing, or the like.

The number of through-holes of the lower protective layer 28 and the upper protective layer 30 may be one or more in the regions where the lower electrodes 24 face each other and the upper electrodes 26 face each other in the laminated piezoelectric film 10L, preferably outside the bent portion of the piezoelectric film 10L. Alternatively, the through-holes of the lower protective layer 28 and the upper protective layer 30 may be formed regularly or irregularly on the entire surface of the lower protective layer 28 and the upper protective layer 30.

The bonding layer 19 having conductivity is not limited, and various known bonding layers can be used.

In the above laminated piezoelectric element, the polarization direction of the laminated piezoelectric film 10 is opposite to that of the adjacent piezoelectric film 10, but the present invention is not limited thereto.

That is, in the present invention, in the laminated piezoelectric element on which the piezoelectric films 10 are laminated, the polarization directions of the piezoelectric layers 20 may be all the same as in the laminated piezoelectric element 60 illustrated in FIG. 9.

As illustrated in FIG. 9, in the laminated piezoelectric element 60 in which the polarization directions of the piezoelectric films 10 to be laminated are all the same, the lower electrode 24 and the upper electrode 26 face each other between the adjacent piezoelectric films 10. Therefore, in a case where the bonding layer 19 is not made sufficiently thick, the lower electrodes 24 and the upper electrodes 26 of the adjacent piezoelectric films 10 may come into contact with each other at the outer end portion of the bonding layer 19 in the plane direction, and there is a risk of a short circuit.

Therefore, as illustrated in FIG. 9, in the laminated piezoelectric element 60 in which the polarization directions of the piezoelectric films 10 to be laminated are all the same, the bonding layer 19 cannot be made thin, and the energy efficiency is inferior to that of the laminated piezoelectric elements illustrated in FIGS. 7 and 8.

Hereinbefore, the polymer-based piezoelectric composite material and the piezoelectric film according to the embodiment of the present invention have been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention.

Example 1

<Preparation of Coating Material>

First, cyanoethylated PVA (CR-V, manufactured by Shin-Etsu Chemical Co., Ltd.) was dissolved in methyl ethyl ketone (MEK) at the following compositional ratio. Thereafter, PZT particles were added to the solution at the following compositional ratio and dispersed using a propeller mixer (rotation speed of 2000 rpm), thereby preparing a coating material for forming a piezoelectric layer.

The treatment of allowing the coating solution to pass through an in-line mixer (MX-F8, manufactured by OHR Laboratory Corporation) at a flow rate of 5 kg/min was repeated for 2 passes to make the air bubbles fine in the coating liquid.

(Coating Material)

PZT particles: 300 parts by mass
Cyanoethylated PVA: 30 parts by mass
MEK: 70 parts by mass In addition, PZT particles obtained by sintering commercially available PZT raw material powder at 1000° C. to 1200° C. and thereafter crushing and classifying the sintered powder to have an average particle diameter of 5 μm were used as the PZT particles.

<Application of Coating Material>

Further, a sheet-like material obtained by performing vacuum vapor deposition on a copper thin film having a thickness of 0.1 μm on a PET film having a thickness of 4 μm was prepared. That is, in the present example, the thin film electrode is a copper-deposited thin film having a thickness of 0.1 m, and the protective layer is a PET film having a thickness of 4 m.

The coating material for forming the piezoelectric layer prepared in advance was applied onto the thin film electrode (copper vapor deposition thin film) of the sheet-like material using a slide coater. Further, the coating material was applied such that the film thickness of the coating film after being dried reached 40 μm.

<Drying Coating Material>

Next, a material obtained by coating the sheet-like material with the coating material was heated and dried on a hot plate at 100° C. for 30 minutes to evaporate a part of MEK. In this manner, a laminate in which the thin film electrode made of copper was provided on the protective layer made of PET and the piezoelectric layer (polymer-based piezoelectric composite material) having a thickness of 40 μm was formed thereon was prepared.

<Polarization Treatment>

Next, the piezoelectric layer of the laminate was subjected to a polarization treatment.

<Lamination of Sheet-Like Material>

The sheet-like material was laminated on the laminate which had been subjected to the polarization treatment in a state where the thin film electrode (copper thin film side) was directed toward the piezoelectric layer. Next, the laminate of the laminate and the sheet-like material was used to bond the piezoelectric layer and the thin film electrode to each other using a laminator device.

A piezoelectric film was prepared by performing the above-described steps.

<Measurement of Pore Volume Per Unit Area>

(Cutting Out of Sample)

A sample was cut out from the prepared piezoelectric film, and the pore volume per unit area was measured by the following method.

The sample was obtained by cutting the piezoelectric film in the thickness direction And cutting out the film to have a size of 12.5 mm×25 mm. As a cutter used to cut out the sample, a craft cutter (product number: XB141, manufactured by Olfa Corporation) was used. In addition, a substitute blade was newly prepared for each sample.

The cut-out sample was weighed using an electronic balance (AW220, manufactured by Shimadzu Corporation), and the number of samples was adjusted such that the total mass of the samples was in a range of 1.2 g to 1.5 g. In Example 1, the number of samples was 27. Further, the total mass of the sample was 1.456 g.

Further, the sample was not subjected to a pretreatment for vacuum exhaust.

(Measurement of Mercury Penetration Amount)

The sample was placed in a cell container of a pore distribution measuring device AUTOPORE IV 9520 (Shimadzu Corporation/Micromeritics Instrument Corporation), and the mercury penetration amount was measured.

As the cell, a 5 cc large piece cell (stem volume of 0.4 cc) was used.

The measurement pressure was set such that the initial pressure was approximately 7 kPa (1.0 psia (corresponding to a pore diameter of approximately 180 μm)) and the maximum pressure was approximately 400 MPa (60000 psia). In this pressure range, the pressure was applied a plurality of times under the conditions shown in FIG. 10. In a case where the pressure was stabilized at a certain pressure value for 10 seconds, the pressure was applied under a condition of the next pressure value.

As the analysis software, AutoPore IV 9500 version 1.09 was used. Further, the physical property values of mercury used for the calculation were set to a mercury contact angle of 130.0 degrees and a mercury surface tension of 485.0 dynes/cm. The blank correction was not used.

The pore distribution was measured under the above-described conditions.

Based on the result of the measured pore distribution, the mercury penetration amount was calculated in the following manner.

The mercury penetration amount was calculated in a pore diameter range of 0.1 μm to 10 μm. That is, the mercury penetration amount (unit: μL/g) per 1 g of the sample was acquired by subtracting the integrated value of the mercury penetration amount in a pore diameter of 10 μm (pressure of approximately 17 psia) from the integrated value of the mercury penetration amount in a pore diameter of 0.1 μm (pressure of approximately 1700 psia). In Example 1, the integrated value of the mercury penetration amount at a pore diameter of 0.1 μm was 0.007422 μL/g, and the integrated value of the mercury penetration amount at a pore diameter of 10 μm was 0.005179 μL/g.

The mercury penetration amount (μL) was acquired by multiplying the mercury penetration amount (μL/g) per 1 g of the acquired sample by the mass of the sample. The mercury penetration amount (μL) of Example 1 was 3.2663 μL.

(Calculation of Cross-Sectional Area of Polymer-Based Piezoelectric Composite Material in Sample)
(Calculation of Cross-Sectional Area of Polymer-Based Piezoelectric Composite Material in Sample)

The total exposed area of the polymer-based piezoelectric composite material, that is, the total cross-sectional area in the sample for which the mercury penetration amount has been acquired is acquired in the following manner.

First, a method of measuring the thickness of the polymer-based piezoelectric composite layer in the cross section of the polymer-based piezoelectric composite material is as follows.

The polymer-based piezoelectric composite material is cut in the thickness direction to observe the cross section of the polymer-based piezoelectric composite material. The polymer-based piezoelectric composite material is cut by mounting a histo knife blade (manufactured by Drukker) having a width of 8 mm on RM2265 (manufactured by Leica Biosystems) and setting the speed to a controller scale of 1 and an engagement amount of 0.25 μm to 1 μm. The cross section thereof is observed with a scanning electron microscope (SEM) (for example, SU8220, manufactured by Hitachi High-Tech Corporation). The sample is conductively treated by Pt vapor deposition, and the work distance is set to 3 mm. The observation is made under conditions of an SE image (Upper) and an acceleration voltage of 0.5 kV, a sharp image is output by focus adjustment and astigmatism adjustment, and automatic brightness adjustment (auto setting, brightness: 0, contrast: 0) is carried out in a state where the polymer-based piezoelectric composite material portion covers the entire screen. The photographing magnification is set as the magnification in which the electrodes at both ends fit on one screen and the width between the electrodes is at least half of the screen.

The length between the two electrode layers laminated on both surfaces of the polymer-based piezoelectric composite material is acquired from the SEM image and used as the thickness of the polymer-based piezoelectric composite material. The same applies to optional ten cross sections, and the average value of the distances between the electrodes is employed as the thickness of the polymer composite piezoelectric layer.

In Example 1, the thickness was 30.1 μm.

The total exposed area (the area of the cross section) of the polymer-based piezoelectric composite layer was acquired by multiplying the acquired thickness of the polymer-based piezoelectric composite material by the total width of the polymer-based piezoelectric composite material in the cross section of the sample, that is, "(12.5 mm+25 mm)×2×number of sheets of samples". In Example 1, the area of the cross section was 60.75 mm$^2$.

(Calculation of Pore Volume)

The pore volume (μL/mm$^2$) per unit area was acquired by dividing the mercury penetration amount (μL) acquired in the above-described manner by the area (mm$^2$) of the cross section of the polymer-based piezoelectric composite material. In Example 1, the pore volume per unit area was 0.05 μL/mm$^2$.

Examples 2 to 4 and Comparative Example 1

A piezoelectric film was prepared in the same manner as in Example 1 except that the conditions for line mixing of the coating material forming the piezoelectric layer were respectively changed to the conditions listed in Table 1 below.

In each example and each comparative example, the pore volume per unit area was measured in the same manner as in Example 1.

[Evaluation]

The change in thermoelectric conversion efficiency with respect to humidity conversion of the prepared piezoelectric film was evaluated as follows.

First, a circular test piece having a diameter of 150 mm was cut out from the prepared piezoelectric film. The test piece was fixed to cover the opening surface of a plastic round case having an inner diameter of 138 mm and a depth of 9 mm, and the pressure inside the case was maintained at 1.02 atm. In this manner, the conversion film was bent into a convex shape like a contact lens to form a piezoelectric speaker.

The prepared piezoelectric speaker was placed in a temperature and humidity control device and allowed to stand in an environment of 25° C. at a humidity of 50% for 24 hours. Thereafter, immediately after taking the speaker out from the temperature and humidity control device, the sound pressure level frequency characteristics of the piezoelectric speaker were measured in a range of 50 Hz to 20 kHz by sine wave sweep measurement using a constant current type power amplifier, thereby acquiring a sound pressure of 1 kHz. Further, the measurement microphone was disposed at a position of 10 cm directly above the center of the piezoelectric speaker. The temperature of the measurement environment was set to 25° C.

Next, the piezoelectric speaker was placed in a temperature and humidity control device and allowed to stand in an environment of 25° C. at a humidity of 80% for 24 hours. Next, immediately after taking the speaker out from the temperature and humidity control device, the sound pressure level frequency characteristics of the piezoelectric speaker were measured in the same manner as described above, thereby acquiring a sound pressure of 1 kHz.

The difference between the sound pressure after the standing in an environment of a humidity of 50% and the sound pressure after the standing in an environment of a humidity of 80%, which was acquired in the above-described manner, was calculated and evaluated based on the following evaluation standards.

A: The difference in sound pressure was less than 2 dB
B: The difference in sound pressure was 2 dB or greater and less than 3 dB
C: The difference in sound pressure was 3 dB or greater and less than 5 dB
D: The difference in sound pressure was 5 dB or greater The results are listed in Table 1.

TABLE 1

|  | Preparation condition Line mixing | | | Piezoelectric layer Pore volume per unit area [μL/mm²] | Evaluation Difference in sound pressure |
| --- | --- | --- | --- | --- | --- |
|  | Availability | Flow rate [kg/min] | Number of times of passing [times] | | |
| Example 1 | Available | 5 | 2 | 0.05 | A |
| Example 2 | Available | 5 | 1 | 0.3 | A |
| Example 3 | Available | 4 | 1 | 0.6 | A |
| Example 4 | Available | 3 | 1 | 1.7 | B |
| Comparative Example 1 | Not available | — | — | 2.2 | D |

As shown in Table 1, in Examples 1 to 4 of the present invention, it was found that the difference between the sound pressure after the standing of the speaker in an environment of a humidity of 50% and the sound pressure after the standing of the speaker in an environment of a humidity of 80% is smaller than those of the comparative examples. That is, it was found that the piezoelectric film according to the embodiment of the present invention can suppress a change in piezoelectric conversion efficiency depending on the humidity of the environment and has stabilized piezoelectric conversion characteristics.

Further, based on the comparison of Examples 1 to 4, it was found that the pore volume per unit area is preferably 0.6 μL/mm² or less.

As described above, the effects of the present invention are apparent.

Suitable use for various usages such as audio equipment including speakers and microphones and pressure-sensitive sensors can be achieved.

EXPLANATION OF REFERENCES 10, 10L: piezoelectric film
10a, 10c: sheet-like material
10b: laminate
12: vibration plate
14, 56, 60: laminated piezoelectric element
16, 19: bonding layer
20: piezoelectric layer
20a: upper surface
24: lower electrode
26: upper electrode
28: lower protective layer
30: upper protective layer
34: matrix
35: pore
36: piezoelectric particles
43: case
45: piezoelectric speaker
45a: rising portion
46: viscoelastic support
48: frame
50: electroacoustic converter
58: core rod
PS: power source
g: interval

What is claimed is:

1. A polymer-based piezoelectric composite material comprising:
piezoelectric particles in a matrix containing a polymer material,
wherein a pore volume per unit area is in a range of 0.01 μL/mm² to 1.7 μL/mm², which is acquired in a manner that an electrode layer is formed on each of both surfaces of the polymer-based piezoelectric composite material to form a piezoelectric film and a mercury penetration amount of a sample obtained by cutting the piezoelectric film in a thickness direction and cutting out the piezoelectric film into a size of 12.5 mm×25 mm is measured by a mercury penetration method, and the penetration amount is divided by an area of a cross section of the sample.

2. The polymer-based piezoelectric composite material according to claim 1,
wherein the polymer-based piezoelectric composite material is polarized in the thickness direction.

3. The polymer-based piezoelectric composite material according to claim 2,
wherein piezoelectric characteristics do not include in-plane anisotropy.

4. The polymer-based piezoelectric composite material according to claim 2,
wherein the polymer material has a viscoelasticity at room temperature.

5. The polymer-based piezoelectric composite material according to claim 1,
wherein piezoelectric characteristics do not include in-plane anisotropy.

6. The polymer-based piezoelectric composite material according to claim 5,
wherein the polymer material has a viscoelasticity at room temperature.

7. The polymer-based piezoelectric composite material according to claim 1,
wherein the polymer material has a viscoelasticity at room temperature.

8. A piezoelectric film comprising:
a polymer-based piezoelectric composite material which contains piezoelectric particles in a matrix containing a polymer material; and
an electrode layer which is formed on each of both surfaces of the polymer-based piezoelectric composite material,
wherein a pore volume per unit area is in a range of 0.01 μL/mm² to 1.7 μL/mm², which is acquired in a manner that a mercury penetration amount of a sample obtained by cutting the piezoelectric film in a thickness direction and cutting out the piezoelectric film into a size of 12.5 mm×25 mm is measured by a mercury penetration method, and the penetration amount is divided by an area of a cross-section of the polymer-based piezoelectric composite material of the sample.

9. The piezoelectric film according to claim 8, further comprising:
   a protective layer laminated on a surface of the electrode layer opposite to a surface on the polymer-based piezoelectric composite material side.

10. The piezoelectric film according to claim 9, wherein the polymer-based piezoelectric composite material is polarized in the thickness direction.

11. The piezoelectric film according to claim 9, wherein piezoelectric characteristics do not include in-plane anisotropy.

12. The piezoelectric film according to claim 9, wherein the polymer material has a viscoelasticity at room temperature.

13. The piezoelectric film according to claim 8, wherein the polymer-based piezoelectric composite material is polarized in the thickness direction.

14. The piezoelectric film according to claim 13, wherein piezoelectric characteristics do not include in-plane anisotropy.

15. The piezoelectric film according to claim 13, wherein the polymer material has a viscoelasticity at room temperature.

16. The piezoelectric film according to claim 8, wherein piezoelectric characteristics do not include in-plane anisotropy.

17. The piezoelectric film according to claim 16, wherein the polymer material has a viscoelasticity at room temperature.

18. The piezoelectric film according to claim 8, wherein the polymer material has a viscoelasticity at room temperature.

* * * * *